United States Patent
Kinoshita et al.

(10) Patent No.: US 7,205,776 B2
(45) Date of Patent: *Apr. 17, 2007

(54) CAPACITANCE MEASURING APPARATUS AND METHOD, AND PROGRAM

(75) Inventors: Masahiro Kinoshita, Kyoto (JP); Hideyuki Urata, Kusatsu (JP); Hideshi Tsugui, Kyotanabe (JP); Yoshihiro Tanabe, Uji (JP)

(73) Assignee: Omron Corporation, Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/221,108

(22) Filed: Sep. 7, 2005

(65) Prior Publication Data

US 2006/0055416 A1    Mar. 16, 2006

(30) Foreign Application Priority Data

Sep. 8, 2004    (JP) ............................ P2004-261575

(51) Int. Cl.
*G01R 27/26*    (2006.01)
*G06K 9/00*    (2006.01)

(52) U.S. Cl. ...................... 324/658; 324/686; 382/115; 382/124

(58) Field of Classification Search ................. 324/658, 324/686; 382/115, 124
See application file for complete search history.

(56) References Cited

U.S. PATENT DOCUMENTS

| | | | | |
|---|---|---|---|---|
| 5,073,757 A | * | 12/1991 | George | .................. 324/677 |
| 6,438,257 B1 | * | 8/2002 | Morimura et al. | .......... 382/124 |
| 6,555,888 B2 | * | 4/2003 | Lepert et al. | ................ 257/415 |
| 6,583,632 B2 | * | 6/2003 | Von Basse et al. | ......... 324/678 |
| 6,661,239 B1 | * | 12/2003 | Ozick | .......................... 324/658 |
| 6,681,033 B1 | * | 1/2004 | Yano et al. | .................. 382/124 |
| 7,015,705 B2 | * | 3/2006 | Inaba et al. | .................. 324/678 |

FOREIGN PATENT DOCUMENTS

| | | |
|---|---|---|
| JP | 7-318365 | 12/1995 |
| JP | 2002-530680 | 9/2002 |

* cited by examiner

*Primary Examiner*—Andrew H. Hirshfeld
*Assistant Examiner*—John Zhu
(74) *Attorney, Agent, or Firm*—Osha Liang LLP

(57) ABSTRACT

Whether a human body is touching or not is detected highly accurately at high speed. Switch SW1 is turned on to charge condenser Ca by power supply Vcc. The switch SW1 is turned off to transfer the electric charge charged in the condenser Ca to condensers Cs and Cx. The switches SW2 and SW3 are repeatedly turned on and off for a predetermined short time, and thus the electric charge charged in the condenser Ca is slowly discharged through resistor R. The unknown charging voltage Vx of the condenser Cx is compared with the reference voltage Vref by comparator Comp, and the unknown capacitance of the condenser Cx is computed based on the number of times to count turning on and off until it is smaller than the reference voltage Vref. When the computed unknown capacitance of the condenser Cx is the value near the capacitance of a human body, it is determined that a human body is touching. The invention can be applied to a touch sensor.

7 Claims, 15 Drawing Sheets

|  | SW1 | SW2 | OPERATE |
|---|---|---|---|
| FIRST STEP | ON | OFF | CHARGE C1 |
| SECOND STEP | OFF | OFF | HOLD |
| THIRD STEP | OFF | ON | TRANSFER C1 TO C2 |
| FOURTH STEP | OFF | OFF | HOLD |

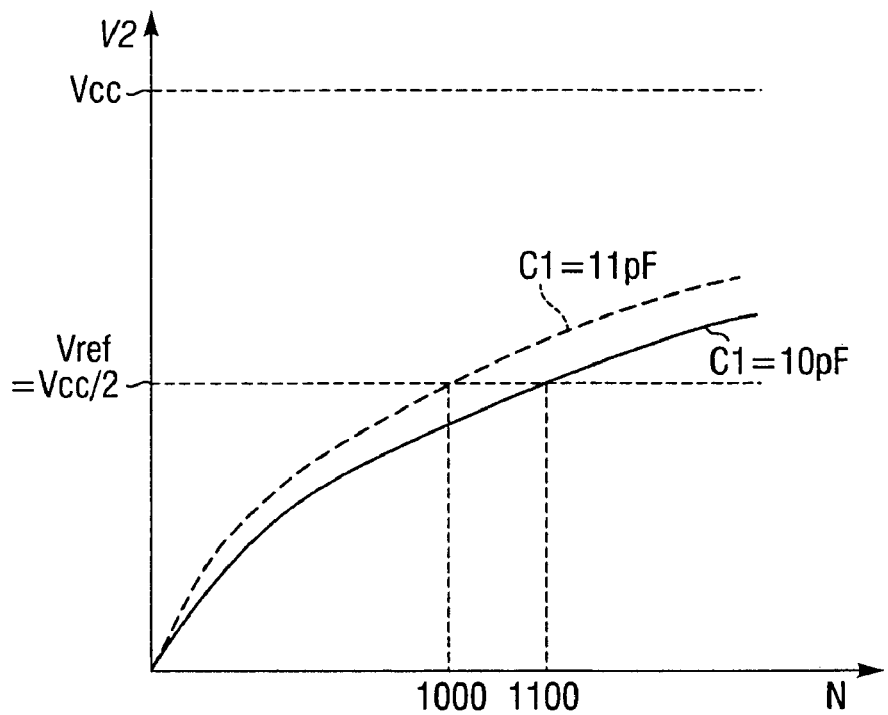
*FIG. 4*   PRIOR ART
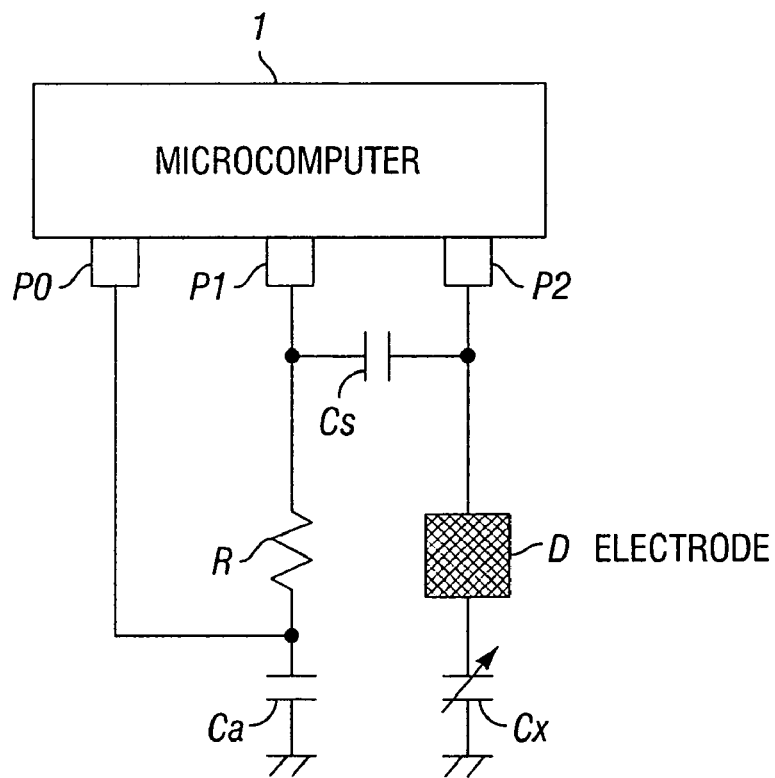
*FIG. 5*

|  | SW1 | SW2 | SW3 |
|---|---|---|---|
| FIRST STEP | ON | ON/OFF | ON/OFF |
| SECOND STEP | OFF | OFF | OFF |
| THIRD STEP | OFF | ON | ON |
| FOURTH STEP | OFF | OFF | OFF |
| FIFTH STEP | OFF | OFF | OFF |

| | SW1 | SW2 | SW3 |
|---|---|---|---|
| FIRST STEP | ON | OFF | ON/OFF |
| SECOND STEP | OFF | OFF | OFF |
| THIRD STEP | OFF | ON | ON |
| FOURTH STEP | OFF | OFF | OFF |
| FIFTH STEP | OFF | OFF | OFF |

CAPACITANCE MEASURING APPARATUS AND METHOD, AND PROGRAM

BACKGROUND OF THE INVENTION

1. Field of the Invention

The present invention relates to a capacitance measuring apparatus, a method, and a program, more specifically to a capacitance measuring apparatus, a method, and a program which can determine whether a human body is touching or not highly accurately at high speed.

2. Description of the Related Art

A touch sensor that detects whether a human body is touching or not based on the variation in the capacitance of electrodes generally becomes widespread.

The touch sensor detects the capacitance of an electrode part to be a touch portion, determines whether the detected capacitance is the capacitance held by a human body, and thus detects the state that a human body is touching or not. The touch sensor is adapted to operation buttons of elevators and a launcher for balls of pachinko machines, for example.

FIG. 1 depicts the circuit configuration of a capacitance measuring apparatus of a switched capacitor mode for use in a traditional touch sensor.

Power supply Vcc is connected to one end part of condenser C1 through switch SW1. When the switch SW1 is turned on (turned to a connected state), the condenser C1 is charged at the charging voltage Vcc supplied from the power supply Vcc. The other end part of the condenser C1 is grounded. In FIG. 1, the charging voltage of the condenser C1 is set to voltage V1.

Switch SW2 is disposed between one end part of the condenser C1 and one end part of condenser C2. When it is turned on (turned to a connected state), the electric charge charged in the condenser C1 is charged as electric charge corresponding to the combined capacitance of the condenser C1 with the condenser C2. In addition, basically, the switches SW1 and SW2 are not turned on at the same time because of the function.

In the circuit shown in FIG. 1, capacitance is unknown in the condenser C1, whereas capacitance is known in the condenser C2. The circuit shown in FIG. 1 is used to measure the capacitance of the condenser C1, it is determined whether a human body has touched or not, and thus it functions as a touch sensor. More specifically, the condenser C1 is formed in a so-called capacitor (condenser) which accumulates electric charge in the circuit, but it is actually configured as an electrode that a human body can touch. Therefore, when the electrode is touched by a human body, the human body itself is the condenser C1 (it is a capacitor having the capacitance held by the human body).

Next, a capacitance detection process will be described with reference to FIGS. 2 and 3. As shown in FIG. 2, in a process at a first step, the switch SW1 is turned on, the switch SW2 is turned off, and then charging the condenser C1 is started. More specifically, at Time t0 shown in FIG. 3, the switch SW1 is turned on, the switch SW2 is turned off, and then the charging voltage Vcc is applied to the condenser C1.

Furthermore, in FIG. 3, a fine line in the upper part in the drawing depicts the charging voltage V1 of the condenser C1, and a thick line depicts the charging voltage V2 of the condenser C2. Moreover, the operation states of the switches SW1 and SW2 being on or off is depicted in the lower part in FIG. 3. The switches SW1 and SW2 are off when they are high level, whereas they are on when they are low level.

In a process at a second step, as shown in Time t1 in FIG. 3, both of the switches SW1 and SW2 are turned off, and then the condenser C1 is held in the state it is charged at the charging voltage V1 (=the power supply voltage Vcc of the power supply Vcc). In addition, since the condenser C2 is not charged with electric charge at this time, the charging voltage V2=0.

In a process at a third step, as shown in Time t2 in FIG. 3, the switch SW1 remains off, the switch SW2 is turned to the ON state, and thus the electric charge charged in the condenser C1 is transferred to the condenser C2.

In a process at a fourth step, as shown in Time t3 in FIG. 3, both of the switches SW1 and SW2 are turned off, and then the condensers C1 and C2 is held in the state that electric charge is charged at the charging voltages V1 and V2, respectively.

Here, since the charging voltages V1 and V2 of the condensers C1 and C2 are equally held, electric charge is accumulated in accordance with the capacity ratios of the condensers C1 and C2. More specifically, electric charges Q1 and Q2 charged in the condensers C1 and C2 are expressed by the following equations (1) and (2).

$$Q1 = C1 \times V1 = C1 \times Vcc \times (C1/(C1+C2)) \text{(at } T1\text{)} \quad (1)$$

$$Q2 = C2 \times V2 = C1 \times Vcc \times (C2/(C1+C2)) \text{(at } T1\text{)} \quad (2)$$

Accordingly, the charging voltage V2 of the condenser C2 is expressed by the following Equation (3).

$$V2 = Vcc \times (C1/(C1+C2)) \text{(at } T1\text{)} \quad (3)$$

Where cycle T1 is the repeated processing number when the processes at the first to fourth steps are repeated, and it is cycle TL when the repeated processing number is L times. In FIG. 3, the cycle T1 is the period from Time t2 to Time t6.

Furthermore, after the process at the fourth step is finished, the process returns to the process at the first step and the processes after that are repeated.

More specifically, the processes at the first to fourth steps are repeated, and then, for example, in the second time process, the switch SW1 is turned on, and the switch SW2 is turned off in the process at the first step. The charge of electric charge is started to the condenser C1, the switch SW1 is turned on, and the switch SW2 is turned off at Time t4 shown in FIG. 3. Thus, the charging voltage Vcc is applied to the condenser C1.

In the process at the second step, as shown in Time t5 in FIG. 3, both of the switches SW1 and SW2 are turned off, and thus the condenser C1 is held in the state that electric charge is charged at the charging voltage V1 (=the power supply voltage Vcc of the power supply Vcc). In addition, at this time, the condenser C2 remains in the state that electric charge is charged at the charging voltage expressed by the Equation (3) described above.

In the process at the third step, as shown in Time t6 in FIG. 3, the switch SW1 remains off and the switch SW2 is turned to the ON state. Thus, the electric charge charged in the condenser C1 is transferred to the condenser C2.

In the process at the fourth step, as shown in Time t7 in FIG. 3, both of the switches SW1 and SW2 are turned off, the condensers C1 and C2 are held in the state that electric charge is charged at the charging voltages V1 and V2, respectively.

Since the charging voltages V1 and V2 of the condensers C1 and C2 are also equally held here, electric charge is accumulated in accordance with the capacity ratios of the condensers C1 and C2. More specifically, the electric charges Q1 and Q2 charged in the condensers C1 and C2 are expressed by the following equations (4) and (5).

$$Q1 = C1 \times V1 \quad (4)$$
$$= (((C1 \times Vcc) + (C1 \times Vcc \times C2/(C1+C2))) \times C1/(C1+C2))$$
$$= Vcc \times C1(1+C2/(C1+C2)) \times (C1/(C1+C2)) \text{ (at } T2\text{)}$$
$$= Vcc \times C1((C1^2 + 2 \times C1 \times C2)/(C1+C2)^2) \text{ (at } T2\text{)}$$

$$Q2 = C2 \times V2 \quad (5)$$
$$= (((C1 \times Vcc) + (C1 \times Vcc \times C2/(C1+C2))) \times C2/(C1+C2))$$
$$= Vcc \times C1(1+C2/(C1+C2)) \times (C2/(C1+C2)) \text{ (at } T2\text{)}$$
$$= Vcc \times C2((C1^2 + 2 \times C1 \times C2)/(C1+C2)^2) \text{ (at } T2\text{)}$$

Therefore, the charging voltage V2 of the condenser C2 is expressed by the following Equation (6).

$$V2 = Vcc \times C2((C1^2 + 2 \times C1 \times C2)/(C1+C2)^2) \text{(at } T2\text{)} \quad (6)$$

As described above, the processes at the first to fourth steps are repeated to rerun the same processes as the processes that have been run in the cycle T1 from Time t2 to Time t6, and proceed to the cycles T2, T3 and so on. Moreover, as the cycle advances, the voltage of C2/(C1+C2) in the differential voltage of the charging voltage between the condensers C2 and C1 is sequentially added to the charging voltage V2 of the condenser C2. More specifically, as shown in FIG. 3, the charging voltage V2 of the condenser C2 is V2a=Vcc×C2/(C1+C2) in the cycle T1, V2b=Vcc×C2/(C1+C2)+(Vcc−Vcc×C2/(C1+C2))×C2/(C1+C2) in the cycle T2, V2c=Vcc×C2/(C1+C2)+(Vcc−Vcc×C2/(C1+C2))×C2/(C1+C2)+(Vcc−(Vcc×C2/(C1+C2)+(Vcc−Vcc×C2/(C1+C2))×C2/(C1+C2))×C2/(C1+C2) in the cycle T3. Here, as shown in FIG. 3, for the relationship with the charging voltage V1 of the condenser C1, the relationship of V2a+V1a=V2b+V1b=V2c+V1c is satisfied.

Consequently, in the case of the cycle TN (the repeated processing number in the processes at the first to fourth steps is done for N times), the charging voltage V2 of the condenser C2 is expressed by the following Equation (7).

$$V2 = Vcc \times (1-(C2/(C1+C2))^N) \quad (7)$$

As shown in Equation (7), the charging voltage V2 of the condenser C2 is increased in accordance with the processing number N. Furthermore, in Equation (7), since the capacitance of the condenser C1 is known, the capacitance of the condenser C2 is to be determined based on the processing number N until the charging voltage V2 reaches the reference voltage Vref.

For example, it is applied to the circuit configuration of a touch sensor in which a human body does not directly touch an electrode and human body's touch (closeness) is detected through an insulator. Then, as shown in FIG. 4, suppose the parasitic capacitance of the condenser C1 (the capacitance when a human body does not touch) is 10 pF when the reference voltage Vref is Vref=Vcc/2 and the capacitance of the condenser C2 is 16000 pF. The charging voltage V2 reaches the reference voltage Vref when the processing number N is 1000 times. On the other hand, suppose the capacitance of the condenser C1 is 11 pF (the capacitance that is increased by human body's touch (closeness) is 1 pF with respect to the capacitance when a human body does not touch the condenser C1). The charging voltage V2 reaches the reference voltage when the processing number N is 1100 times. Where a time interval between Time ti and Time t(i+1) is 2 µS, and thus, the processing cycle Ti–T(i+1) is 8 µS.

More specifically, the capacitance of the condenser C1 is determined from the processing number N when the charging voltage V2 of the condenser C2 reaches the reference voltage Vref.

In addition, in the case of FIG. 4, the processing number N has a difference of 100 times between at times when a human body touches and when it does not touch. Suppose the difference is regarded as resolving power, the resolving power for a human body touching or not can be considered as: the repeated processing number N=100. As the resolving power is greater, that is, the difference of the processing number between the state that a human body touches and the state that it does not touch is greater, it can be said that whether a human body is touching or not can be determined more highly accurately.

Based on the principle like this, the touch sensor of the switched capacitor mode determines whether a human body is touching or not (for example, Patent Documents 1 and 2).

Patent Document 1: JP-T-2002-530680

The term "JP-T" as used herein means a published Japanese translation of PCT patent application.

Patent Document 2: JP-A-7-318365

SUMMARY OF THE INVENTION

In the meantime, in the touch sensor which detects human body's touch or closeness, it needs to do a process that determines the detected result of capacitance such as prevention of malfunctions by the computation of a microcontroller.

However, it is possible to take data in the microcontroller by traditional technology, but when the variation in capacitance is small with respect to parasitic capacitance and the varied amount is detected by high resolving power, the switched capacitor mode described in Patent Document 1 has a problem that the entire electric charge in the condenser is discharged in measurement and measurement is done as charged from the charging voltage at 0 V by repeating processes. In addition to this, when the above-described time t (=Time t(i+1)−(Time ti) is shortened as much as possible, the processing number is increased to cause a prolonged measuring time period.

Furthermore, the Patent Document 2 has a problem that AD (Analog to Digital) conversion is required to take data in a microcontroller, highly accurate measurement cannot be conducted without an AD converter of high resolving power, and an expensive component is required to improve accuracy.

The invention has been made in view of the problem, which can particularly measure unknown capacitance by an inexpensive apparatus highly accurately at high speed, and can determine whether a human body is touching or not highly accurately at high speed based on the measurement result of capacitance.

A capacitance measuring apparatus according to the invention includes:

a third capacitor which has one end part thereof connected to the other end part of the circuit and the other end part thereof grounded, and applies charging voltage thereof to the other end part of the circuit to charge a first capacitor and a second capacitor with electric charge;

a first discharging module which partially discharges the electric charge charged in the third capacitor, and discharges the entire electric charge charged in the first capacitor;

a second discharging module which discharges the entire electric charge charged in the second capacitor at almost the same timing as the first discharging module;

a number counting module which counts numbers of discharges of the first discharging module and the second discharging module;

a comparison module which compares charging voltage of the second capacitor with reference voltage; and a computing module which computes capacitance of the second capacitor, when discharge of the first discharging module and the second discharging module is repeated, at a time when the charging voltage of the second capacitor is matched with the reference voltage or when the charging voltage of the second capacitor is smaller than the reference voltage from the compared result of the comparison module, based on the number of discharges counted by the number counting module.

The first discharging module can partially discharge the electric charge charged in the third capacitor by discharging the electric charge charged in the third capacitor only for a predetermined time period through a resistor serially connected to the third capacitor.

The apparatus can further include a charging module which charges the third capacitor at a predetermined charging voltage, wherein the charging module can directly charge the third capacitor.

The apparatus can further include a charging module which charges the third capacitor at a predetermined charging voltage, wherein the first discharging module can have one end part thereof grounded and the other end part thereof connected between the circuit and the resistor, and the charging module can charge the third capacitor from a same position as the other end part of the first discharging module.

The second capacitor can further include an electrode, and the electrode can be directly or indirectly touched by a human body through an insulator.

A capacitance measuring method according to the invention includes:

a first discharge step of partially discharging electric charge charged in the third capacitor and discharging the entire electric charge charged in the first capacitor;

a second discharge step of discharging the entire electric charge charged in the second capacitor at almost the same timing as the process at the first discharge step;

a number measuring step of counting numbers of discharges in the processes at the first discharge step and the second discharge step;

a comparing step of comparing charging voltage of the second capacitor with reference voltage; and a computing step of computing capacitance of the second capacitor, when discharge in the processes at the first discharge step and the second discharge step are repeated, at a time when the charging voltage of the second capacitor is matched with the reference voltage or when it becomes smaller than the reference voltage from the compared result in the process at the comparing step, based on the number of discharges counted in the process at the number measuring step.

A program according to the invention allows a computer to implement:

a first discharge control step of controlling partially discharging electric charge charged in the third capacitor and discharging the entire electric charge charged in the first capacitor;

a second discharge control step of controlling discharging the entire electric charge charged in the second capacitor at almost the same timing as the process at the first discharge step;

a number measuring control step of controlling counting numbers of discharges in the processes at the first discharge step and the second discharge step;

a comparison control step of controlling comparing charging voltage of the second capacitor with reference voltage; and a computation control step of controlling computing capacitance of the second capacitor, when discharge in the processes at the first discharge step and the second discharge step is repeated, at a time when the charging voltage of the second capacitor is matched with the reference voltage or when it becomes smaller than the reference voltage from the compared result in the process at the comparing step, based on the number of discharges counted in the process at the number measuring control step.

In the capacitance measuring apparatus, the method, and the program according to the invention, the third capacitor which has one end part thereof connected to the other end part of the circuit and the other end part thereof grounded applies the charging voltage thereof to the other end part of the circuit, and electric charge is charged in the a first capacitor and the second capacitor. The first discharging module partially discharges the electric charge charged in the third capacitor, and discharges the entire electric charge charged in the first capacitor. The second discharging module discharges the entire electric charge charged in the second capacitor at almost the same timing as the first discharging module. The number counting module counts numbers of discharges of the first discharging module and the second discharging module. The comparison module compares charging voltage of the second capacitor with reference voltage. The computing module computes capacitance of the second capacitor, when discharge of the first discharging module and the second discharging module is repeated, at a time when the charging voltage of the second capacitor is matched with the reference voltage or when the charging voltage of the second capacitor is smaller than the reference voltage from the compared result of the comparison module, based on the number of discharges counted by the number counting module.

The capacitance measuring apparatus according to the invention may be an independent apparatus or may be a block which measures capacitance.

According to the invention, unknown capacitance can be measured by an inexpensive apparatus highly accurately at high speed, and whether a human body is touching or not can be determined highly accurately at high speed based on the measurement result of capacitance.

BRIEF DESCRIPTION OF THE DRAWINGS

The teachings of the invention can be readily understood by considering the following detailed description in conjunction with the accompanying drawings, in which:

FIG. 4 is a diagram illustrative of the operation of the touch sensor shown in FIG. 1;

FIG. 5 is a diagram illustrative of the configuration of an embodiment of a touch sensor to which the invention is applied;

DESCRIPTION OF THE PREFERRED EMBODIMENT

Hereinafter, embodiments according to the invention will be described. Correspondence between the invention described in the specification and embodiments according to the invention is exemplified as follows. The description is for confirming that the embodiments supporting the invention described in the specification are described in the specification. Therefore, even though there is an embodiment that is described in embodiments but is not described here as corresponds to the invention, this does not mean that that embodiment does not correspond to the invention. On the contrary, even though an embodiment is described here as corresponds to the invention, it does not mean that that embodiment corresponds only to that invention not to other invention.

Furthermore, the description does not mean the entire invention described in the specification. In other words, the description is the invention described in the specification, which will not deny the existence of the invention that is not claimed in this application, that is, the existence of the invention that will appear or be added by divisional application and amendment in future.

More specifically, a capacitance measuring apparatus according to the invention has a first capacitor (for example, condenser Cs shown in FIG. 6); a second capacitor (for example, condenser Cx shown in FIG. 6); a third capacitor (for example, condenser Ca shown in FIG. 6) which one end part is connected to the other end part of a circuit and the other end part is grounded in which the charging voltage itself is applied to the other end part of the circuit to charge electric charge to the first and second capacitors; a first discharging module (for example, switch SW2 shown in FIG. 6) which partially discharges the electric charge charged in the third capacitor and discharges the entire electric charge charged in the first capacitor; a second discharging module (for example, switch SW3 shown in FIG. 6) which discharges the entire electric charge charged in the second capacitor at almost the same timing as the first discharging module; a number counting module (for example, a counter 13*a* shown in FIG. 7) which counts the numbers of discharges of the first discharging module and the second discharging module; a comparison module (for example, a comparison module 13*b* shown in FIG. 7) which compares the charging voltage of the second capacitor with the reference voltage; and a computing module (for example, a measuring module 13 shown in FIG. 7) which computes the capacitance of the second capacitor, when discharge of the first discharging module and the second discharging module is repeated, at the time when the charging voltage of the second capacitor is matched with the reference voltage or when it becomes smaller than the reference voltage from the compared result of the comparison module, based on the number of discharges counted by the number counting module at that time.

Figures 10, 11:
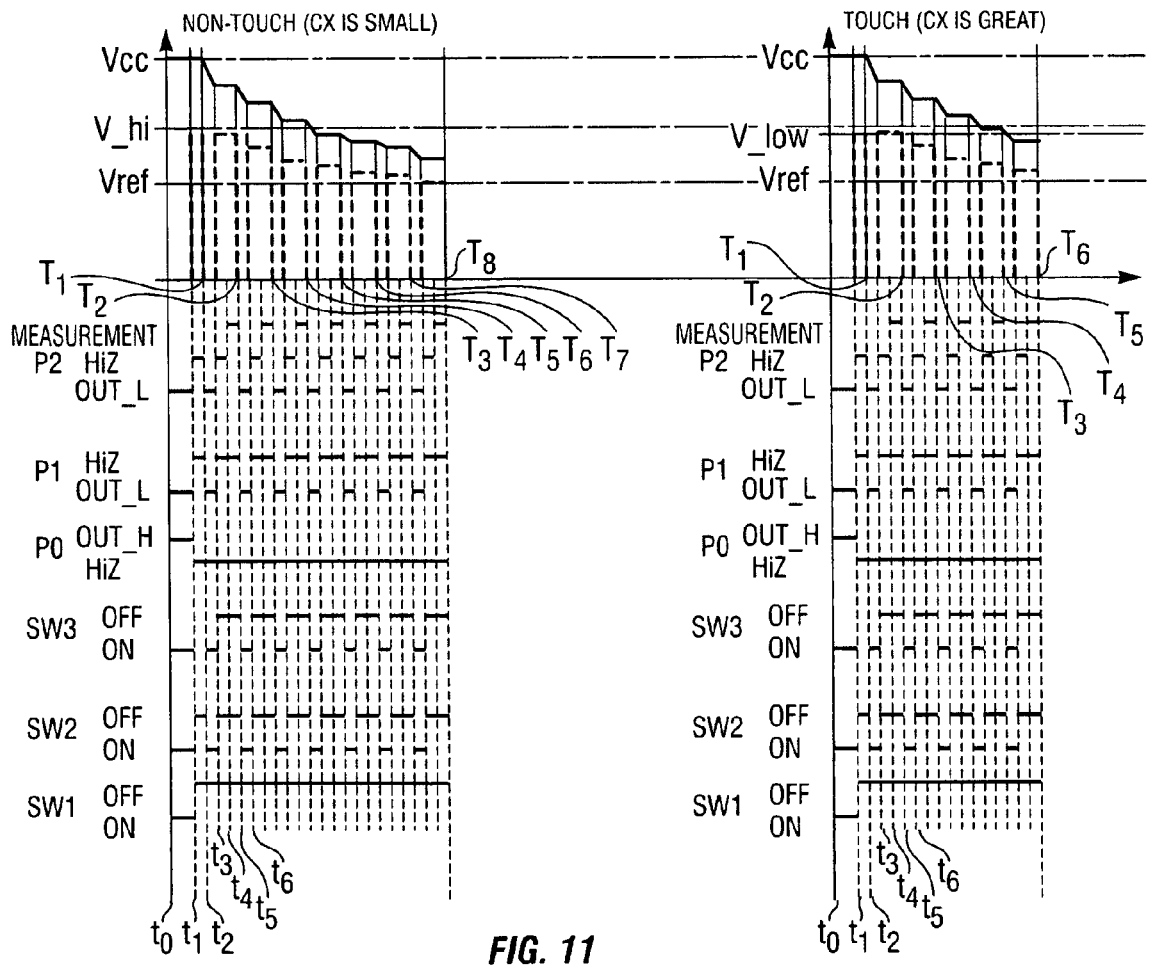
FIG. 10 is a diagram illustrative of the measurement process by the touch sensor shown in FIG. 5.
FIG. 11 is a timing chart illustrative of the measurement process by the touch sensor shown in FIG. 5.

The first discharging module can be formed to partially discharge the electric charge charged in the third capacitor (for example, the condenser Ca shown in FIG. 6) through a resistor (for example, resistor R shown in FIG. 6) which is serially connected to the third capacitor by discharging the electric charge charged in the third capacitor (for example, the condenser Ca shown in FIG. 6) for a predetermined time period (for example, (Time t (i+1)−Time ti) after Time t1 shown in FIG. 11).

A charging module (for example, power supply Vcc shown in FIG. 6) which charges the third capacitor at a predetermined charging voltage can be further disposed, and the charging module can be formed to directly charge the third capacitor.

A charging module (for example, power supply Vcc shown in FIG. 17) which charges the third capacitor at a predetermined charging voltage can be further disposed. The first discharging module can be formed in which one end part is grounded and the other end part is connected between the circuit and the resistor. The charging module can be formed to charge the third capacitor from the same position as the other end part of the first discharging module.

Figure 9:
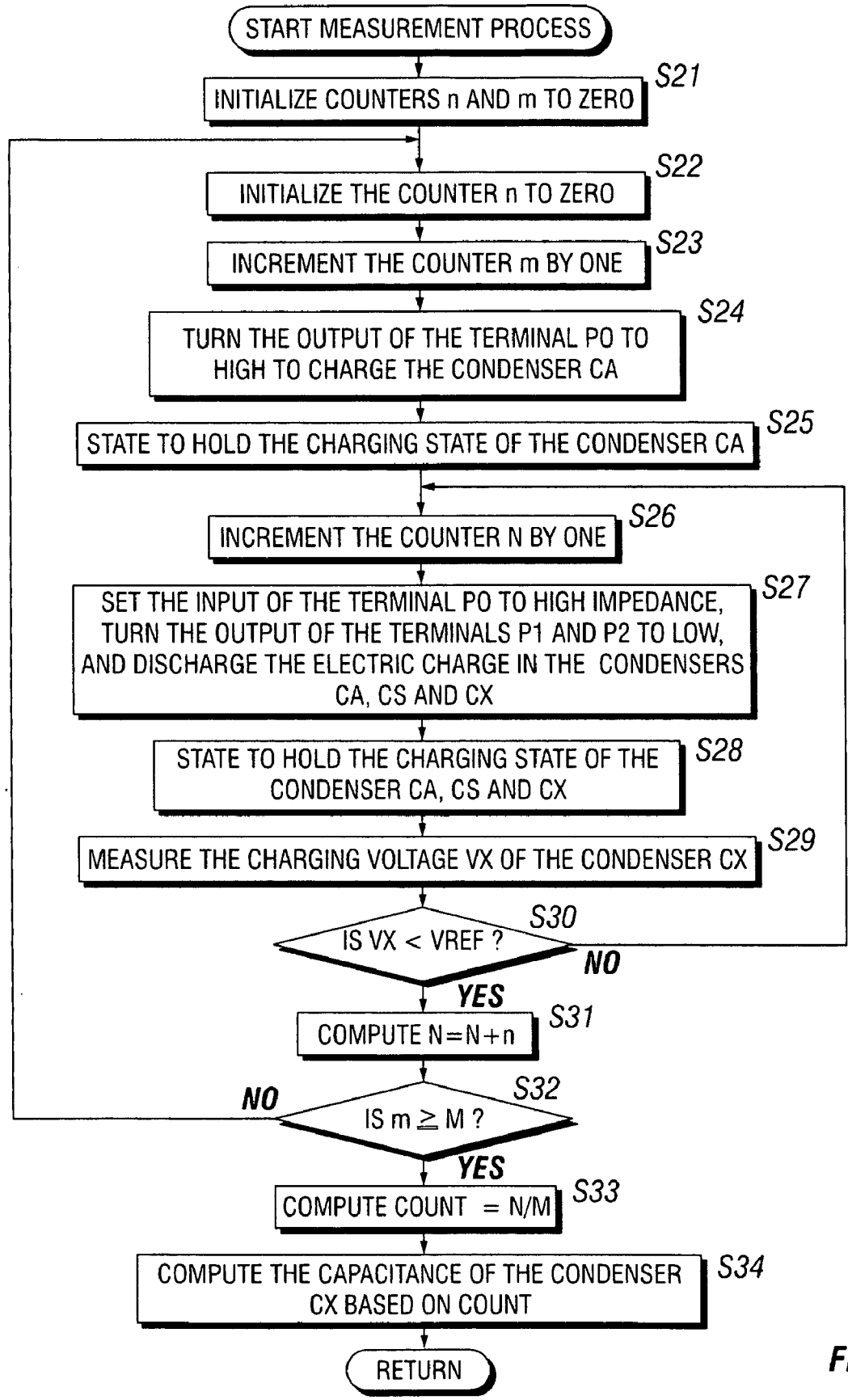
FIG. 9 is a flow chart illustrative of a measurement process by the touch sensor shown in FIG. 5.

A capacitance measuring method according to the invention includes: a first discharge step (for example, a process at Step S27 in a flow chart shown in FIG. 9) of partially discharging the electric charge charged in the third capacitor and discharging the entire electric charge charged in the first capacitor; a second discharge step (for example, a process at Step S27 in the flow chart shown in FIG. 9) of discharging the entire electric charge charged in the second capacitor at almost the same timing as the process at the first discharge step; a number measuring step (for example, a process at Step S26 in the flow chart shown in FIG. 9) of counting the numbers of discharges in the processes at the first discharge step and the second discharge step; a comparing step (for example, a process at Step S30 in the flow chart shown in FIG. 9) of comparing the charging voltage of the second capacitor with the reference voltage; and a computing step (for example, a process at Step S34 in the flow chart shown in FIG. 9) of computing the capacitance of the second capacitor, when discharge in the processes at the first discharge step and the second discharge step is repeated, at the time when the charging voltage of the second capacitor is matched with the reference voltage or when it becomes smaller than the reference voltage from the compared result in the process at the comparing step, based on the number of discharges counted in the process at the number measuring step.

In addition, a program is the same as the capacitance measuring method, omitting the description.

FIG. 5 is a diagram illustrating the configuration of an embodiment of a touch sensor to which the invention is applied.

A microcomputer 1 is formed of a CPU (Central Processing Unit), RAM (Random Access Memory), and ROM (Read Only Memory), which implements various processes in which the CPU expands a predetermined program stored in the ROM to the RAM as necessary. More specifically, the microcomputer 1 implements the program to output high and low signals as output signals to terminals P0 to P2, and sets HiZ (high impedance state: the state that output signals are not high or low where no signal is accepted in a high impedance state with respect to input signals) as well as measures input signals (the voltage of the terminals) as necessary to implement processes in accordance with the measurement result.

The terminal P0 is a terminal that supplies electric power for charging the condenser Ca and applies the charging voltage to the condenser Ca when it is controlled high. In addition, the terminal P0 stops charging when it is controlled to HiZ (high impedance state).

The terminal P1 is a terminal that discharges the electric charge charged in the condenser Ca through the resistor R and discharges the electric charge charged in the condenser Cs. It discharges the electric charge charged in the condensers Ca and Cs when it is controlled low, and stops discharging when controlled to HiZ.

The terminal P2 is a terminal that discharges the electric charge charged in the condenser Cx and measures the charging voltage of the condenser Cx. It discharges the electric charge charged in the condenser Cx when it is controlled low, stops discharging the condenser Cx when controlled to HiZ, and measures the charging voltage Vx of the condenser Cx when controlled high.

The condenser Ca charges electric charge at the voltage applied by the terminal P0, and discharges electric charge to the terminal P1 through the resistor R. The condensers Cs and Cx are serially connected to each other, and are charged with the electric charge charged in the condenser Ca.

The condenser Cx is notation in the circuit configuration, which an object to be measured such as the capacitance of a human body touching the electrode D is expressed as a capacitor. Therefore, the capacitance of the condenser Cx is the capacitance of a human body when the human body touches the electrode D, and is the capacitance in a non-touch state when the human body does not touch the electrode D.

In addition, the electrode D may be configured which a human body can directly touch, or may be configured which a human body can indirectly touch through an insulator. In the description below, for the electrode D, it will be described when a form is adopted that a human body indirectly touches through an insulator, but of course, it is needless to say that it may be a form that a human body directly touches. However, when the form of touching through an insulator is adopted, the variation in capacitance (the difference of the capacitance of the condenser Cx between the case where a human body touches and the case where a human body does not touch) is smaller than the form that a human body directly touches.

Figures 1, 2:
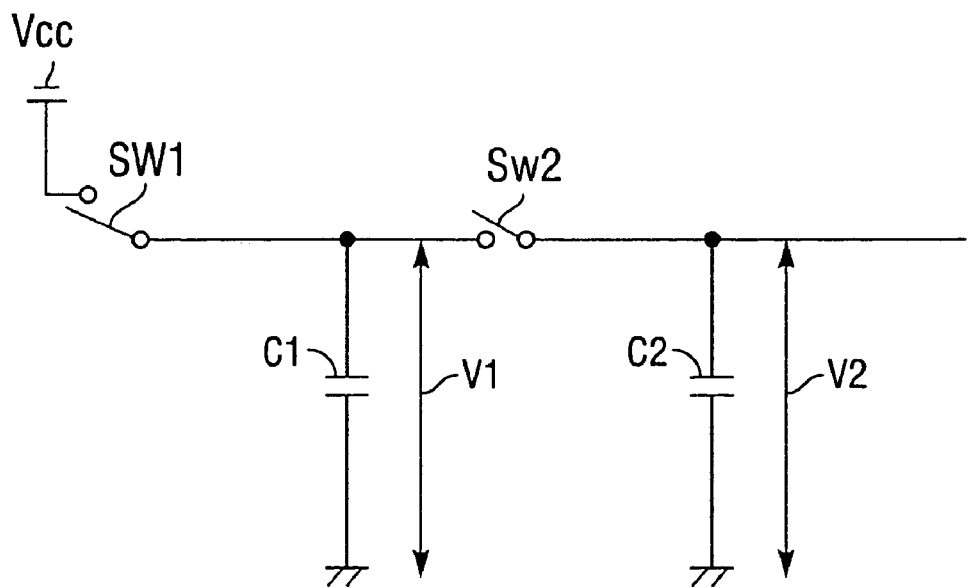
FIG. 1 is a diagram illustrative of a circuit which configures a traditional touch sensor.
FIG. 2 is a diagram illustrative of the operation of the touch sensor shown in FIG. 1.
Figure 3:
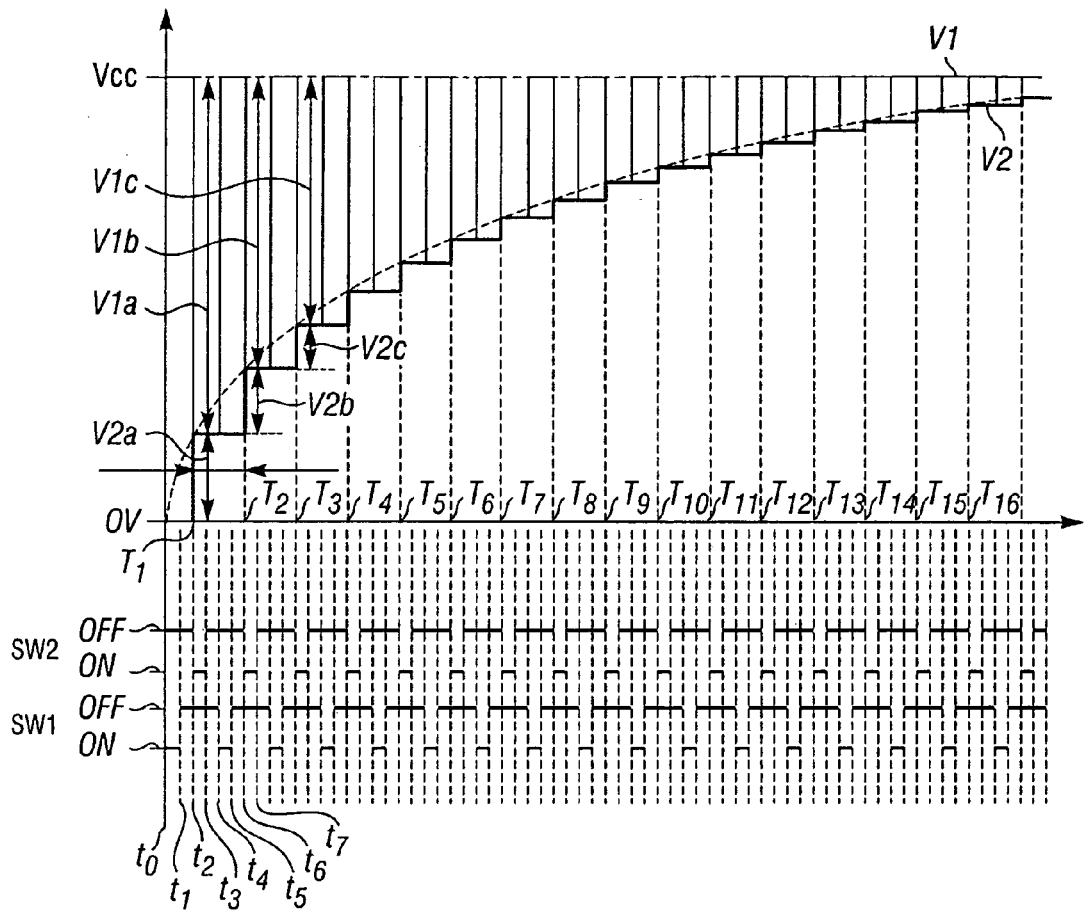
FIG. 3 is a diagram illustrative of the operation of the touch sensor shown in FIG. 1.
Figure 6:
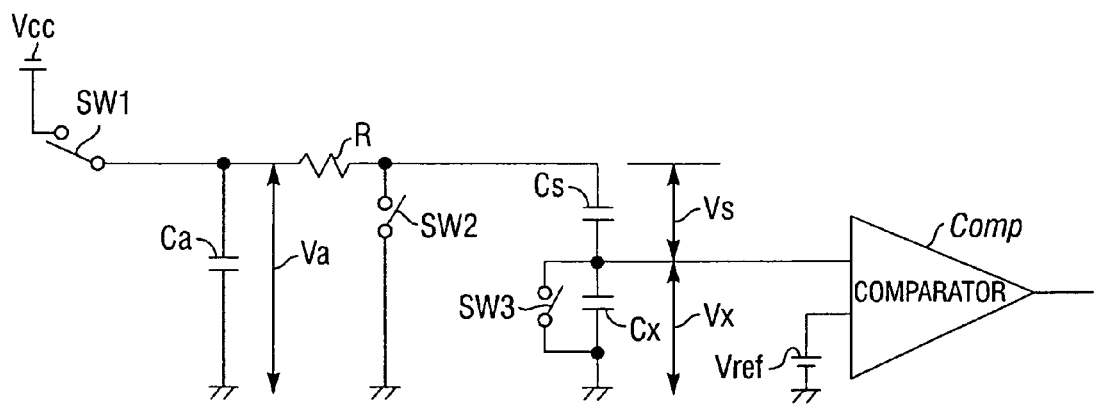
FIG. 6 is a circuit diagram illustrative of the concept of the touch sensor shown in FIG. 5.

FIG. 6 is a circuit diagram illustrative of the concept of the touch sensor shown in FIG. 5.

The switches SW1 to SW3 depict the operation states of the terminals P0 to P2 plain and simple, respectively. More specifically, when the terminal P0 is controlled high, the switch SW1 shown in the circuit in FIG. 6 is turned to the ON state. Consequently, the power supply Vcc charges the condenser Ca at the charging voltage Vcc. On the other hand, when the terminal P0 is controlled to HiZ, the switch SW0 is turned to the OFF state. Furthermore, when the terminal P1 is controlled low, the switch SW2 shown in the circuit in FIG. 6 is turned on, whereas it is controlled to HiZ, the switch is controlled off.

Moreover, when the terminal P2 is controlled low, the switch SW3 is turned on, whereas when it is controlled to HiZ, the switch is turned off. Besides, when the terminal P2 is controlled high, comparator Comp compares the charging voltage Vx of the condenser Cx with the reference voltage Vref and outputs the compared result. In addition, the comparator Comp is the function implemented by the microcomputer 1, described later, which is not an actual comparator circuit.

Besides, the charging voltages of the condensers Ca, Cs and Cx are to be expressed by Va, Vs, and Vx, respectively.

Next, the function implemented by the microcomputer 1 will be described with reference to FIG. 7.

A control module 11 controls the entire operation of the microcomputer 1. When the operation is instructed by an operating module, not shown, it controls a switch operating module 12 to control the operation of the terminals P0 to P2. Furthermore, the control module 11 determines whether a human body has touched or not based on the measurement result of the capacitance of the condenser Cx measured by a measuring module 13, and controls an output module 14 formed of a CRT (Cathode Ray Tube), an LCD (Liquid Crystal Display), or a speaker to show the determination result that a human body has touched or not.

Figure 7:
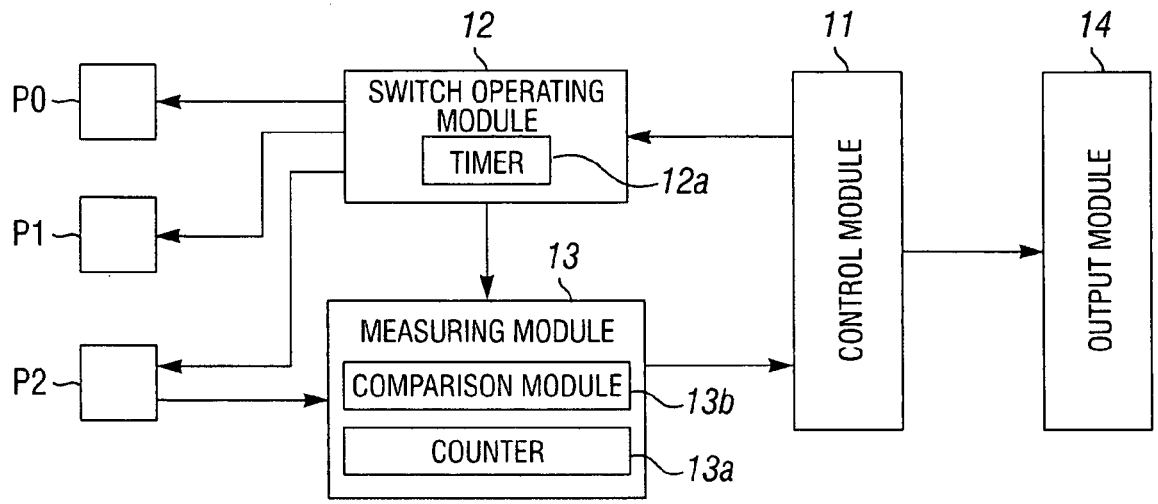
FIG. 7 is a diagram illustrative of the function implemented by a microcomputer shown in FIG. 5.

When the terminal P0 is supplied with a high signal from the switch operating module 12, it charges the condenser Ca by the power supply Vcc at the charging voltage Vcc as similar to the case where the switch SW1 shown in FIG. 6 is turned on, not shown in FIG. 7. Moreover, when the terminal P0 is turned to the HiZ state by the switch operating module 12, it stops the power supply from the power supply Vcc to the condenser Ca as similar to the case where the switch SW1 shown in FIG. 6 is turned off.

When the terminal P1 is turned to the low state by the switch operating module 12, it sets the state that the switch SW2 shown in FIG. 6 is turned on, it gradually discharges the electric charge charged in the condenser Ca from a ground point through the resistor R, and it instantaneously discharges the entire amount of the electric charge charged in the condenser Cs from the ground point. Furthermore, when the terminal P1 is turned to the HiZ state by the switch operating module 12, it sets the state that the switch SW2 shown in FIG. 6 is turned off, and it sets the state that the condenser Ca is connected in parallel with the combined condenser of the condensers Cs and Cx.

When the terminal P2 is turned to the low state by the switch operating module 12, it sets the state that the switch SW3 shown in FIG. 6 is turned on, and it discharges the electric charge charged in the condenser Cx. Furthermore, when the terminal P2 is turned to the HiZ state by the switch operating module 12, it sets the state that the switch SW3 is turned off, and it holds the electric charge charged in the condenser Cx. Moreover, when the terminal P2 is turned to the high state by the switch operating module 12, it measures the charging voltage of the condenser Cx.

The switch operating module 12 refers to Timer 12a incorporated therein to control the operation of the terminals P0 to P2 at every predetermined time interval. More specifically, the switch operating module 12 periodically switches the terminals P0 to P2 to high, HiZ, or low level at every predetermined time interval in a predetermined pattern. Besides, the switch operating module 12 supplies its signal to the measuring module 13 at every time when one cycle of the operation repeated in a predetermined pattern is finished.

The measuring module 13 measures the charging voltage Vx of the condenser Cx supplied from the terminal P2, and compares it with the reference voltage Vref. When the charging voltage Vx is matched with or smaller than the reference voltage Vref, the measuring module 13 measures capacitance based on the processing number n stored in a counter 13a at that time, the capacitance of the condensers Ca and Cs, the resistor R, and the charging voltage Vcc of the power supply Vcc.

The counter 13a of the measuring module 13 counts the number of the cycles (the repeated processing number) n based on the signal supplied from the switch operating module 12 at every time when the operation is repeated in a predetermined pattern, and determines the processing number n on average. Thus, it counts the number m that computes the processing number n, and counts the total sum N of the processing number n for m times.

A comparison module 13b has a configuration corresponding to the comparator Comp shown in FIG. 6, which compares the charging voltage Vx supplied from the terminal P2 with the reference voltage Vref. When the charging voltage Vx is matched with the reference voltage Vref, or when the charging voltage Vx is smaller than the reference voltage Vref, the comparison module 13b computes the capacitance of the condenser Cx based on the processing number n stored in the counter 13a at that time, the capacitance of the condensers Ca and Cs, the resistor R, and the charging voltage Vcc of the power supply Vcc, and outputs it as the measurement result of the condenser Cx to the control module 11.

Next, a touch switch operation process by the touch sensor shown in FIG. 5 will be described with reference to a flow chart shown in FIG. 8.

At Step S1, the control module 11 initializes the operation states of the switch operating module 12 and the measuring module 13.

At Step S2, the control module 11 operates the switch operating module 12 for switching, and allows the measuring module 13 to run the measurement process for the capacitance of the condenser Cx.

Here, a measurement process for the capacitance of the condenser Cx will be described with reference to a flow chart shown in FIG. 9.

At Step S21, the measuring module 13 initializes counters m and n of the counter 13a to zero.

At Step S22, the measuring module 13 initializes the counter n of the counter 13a to zero.

At Step S23, the counter 13a of the measuring module 13 increments the counter m by one.

At Step S24, the switch operating module 12 controls the output of the terminal P0 high, and charges the condenser Ca by the power supply Vcc. More specifically, the output of the terminal P0 is controlled high, and thus the switch SW1 shown in FIG. 6 is turned to the ON state. Electric power is supplied to the condenser Ca by the power supply Vcc, and the condenser Ca is charged at the charging voltage Va=Vcc.

At Step S25, the switch operating module 12 controls all the terminals P0 to P2 to HiZ (high impedance state) only for a predetermined time period t based on the Timer 12a, and holds the charging state of the condenser Ca. More specifically, the terminals P0 to P2 are controlled to the HiZ state, and then the switches SW1 to SW2 shown in FIG. 6 are turned to the OFF state. Thus, the condenser Ca is maintained in the state that it is charged at the charging voltage Va=Vcc.

At Step S26, the counter 13a of the measuring module 13 increments the counter n by one.

At Step S27, the switch operating module 12 controls the terminal P0 to HiZ only for a predetermined time period based on the Timer 12a, controls the terminals P1 and P2 low, and then discharges the electric charge charged in the condensers Ca, Cs and Cx. At this time, the electric charge charged in the condensers Cs and Cx is instantaneously discharged through the ground part. However, since the electric charge charged in the condenser Ca is discharged to the ground part by the switch SW2 through the resistor R, discharging the electric charge proceeds slowly, and only a part of electric charge charged in the condenser Ca is discharged within a predetermined time period t.

At Step S28, the switch operating module 12 controls the terminals P0 to P2 to the HiZ state only for a predetermined time period t based on the Timer 12a, the electric charge charged in the condenser Ca (the electric charge remaining as partially discharged in the process at Step S27) is transferred to the condensers Cs and Cx, and the condensers Ca, Cs and Cx are held in the charged state. At this time, since the condenser Ca forms a parallel circuit with the combined condenser of the condensers Cs and Cx, the charging voltage Va of the condenser Ca is in the state that is equal to the sum of the charging voltages Vs and Vc of the condensers Cs and Cx. Furthermore, the charging voltages Vs and Vx of the condensers Cs and Cx have a relationship of reciprocal proportion to the capacitance of the condensers Cs and Cx.

At Step S29, the switch operating module 12 controls the terminal P2 to the high state only for a predetermined time period t based on the Timer 12a, and the measuring module 13 measures the charging voltage Vx of the condenser Cx by the terminal P2 only for a predetermined time period t to acquire the charging voltage of the condenser Cx.

At Step S30, the comparison module 13b of the measuring module 13 determines whether the measured charging voltage Vx of the condenser Cx is smaller than the reference voltage Vref. For example, when it is determined that the charging voltage Vx is not smaller than the reference voltage Vref, the process returns to Step S26. More specifically, at Step S30, the processes from Steps S26 to S30 are repeated until it is determined that the charging voltage Vx is smaller than the reference voltage Vref, and the value of the counter n is incremented in accordance with the repeated processing number.

When it is determined that the charging voltage Vx is smaller than the reference voltage Vref at Step S30, at Step S31, the measuring module 13 adds the processing number n determined now to the total sum N of the processing numbers where the processes from Steps S26 to S30 have been repeated.

At Step S32, the measuring module 13 determines whether the counter m which indicates the repeated processing number n reaches the upper limit value M of the counter m set beforehand or greater. When it is determined that the counter m does not reach the upper limit value M or greater, the process returns to Step S22. More specifically, the processes from Steps S22 to S32 are repeated until the counter m reaches the upper limit value M or greater.

When it is determined that the counter m reaches the upper limit value M or greater at Step S32, at Step S33, the measuring module 13 determines as count the mean value of M times for the processing number n from Steps S26 to S30 until the charging voltage Vx of the condenser Cx drops to the reference voltage Vref.

At Step S33, the measuring module 13 computes the capacitance of the condenser Cx based on the mean value count for the processing number n, the capacitance of the condensers Ca and Cs, a predetermined time t where the processes at Steps S25, S27, and S28 have been run, the charging voltage Vcc of the power supply Vcc, and the reference voltage Vref, it outputs the capacitance to the control module 11, and it ends the measurement process.

More specifically, in summary of the process described above, a process at a first step shown in FIG. 10 is run by the process at Step S24, that is, the switch SW1 shown in FIG. 6 is turned to the ON state. Since this process is the process that the condenser Ca is only charged, the switches SW2 and SW3 may be on or may be off.

Consequently, in the process at the first step shown in FIG. 10, the terminal P0 is controlled high at Time t0 as shown in the left part of FIG. 11. Thus, the switch SW1 shown in FIG. 6 is turned to the ON state, and the condenser Ca is charged at the charging voltage Va=Vcc. In addition, in FIG. 11, the switches SW2 and SW3 are turned on (the terminals P1 and P2 are low), but the charging voltage of the upper condenser Cx shows the charging voltage Vx=V_hi where the switches SW2 and SW3 are off and it is charged through the resistor R. At this time, since the condensers Cs and Cx are serially connected, Va=Vx+Vc is held. Furthermore, since the condensers Cs and Cx are serially connected, the ratio between the charging voltages Vx and Vc is Vx:Vs=1/Cs:1/Cx.

In addition, in FIG. 11, in the upper graph, a thick solid line depicts the charging voltage Va of the condenser Ca, and a doted line depicts the charging voltage Vx of the condenser Cx. Furthermore, the operation state of the terminal P2 is depicted therebelow, measurement expresses the state that (the charging voltage Vx) of the condenser Cx is measured by the measuring module 13 through the terminal P2, HiZ expresses the high impedance state, that is, the state that the terminal P2 does no output, and OUT_L expresses the state set low.

The operation state of the terminal P1 is depicted below the terminal P2. HiZ expresses the high impedance state, that is, the state that the terminal P1 does no output, and OUT_L expresses the state set low. The operation state of the terminal P0 is depicted below the terminal P1. HiZ expresses the high impedance state, that is, the state that the terminal P0 does no output, and OUT_L expresses the state set low.

Moreover, the operation states of the switch SW3 to SW1 are individually depicted therebelow. In addition, the operation of the switch SW1 is done together with the terminal P0; the switch SW1 is turned to the ON state only when the terminal P0 is set to high, and is in the OFF state other than that time. Furthermore, the operation of the switches SW2 and SW3 is done together with the terminals P1 and P2; they are turned to the ON state only when the terminals P1 and P2 are set low, and are in the OFF state other than that. Moreover, various process timings shown in FIG. 11 are slightly shifted because of the procedures for processes by the program installed in the microcomputer 1, even the same timing in FIG. 11, for example, but it can be ignored enough throughout the operation.

Furthermore, a process at a second step shown in FIG. 10 is run by the process at Step S25, that is, the switches SW1 to SW3 shown in FIG. 6 are turned to the OFF state. Consequently, in the process at the second step shown in FIG. 10, the terminals P0 to P2 are controlled to HiZ at Time t1, as shown in the left part in FIG. 11, the switches SW1 to SW3 shown in FIG. 6 are turned to the OFF state, and the condenser Ca is held in the state that it is charged at the charging voltage Va=Vcc.

Then, a process at a third step shown in FIG. 10 is run by the process at Step S27, that is, the switch SW1 shown in FIG. 6 is turned off, and the switches SW2 and SW3 are turned on. Consequently, in the process at the third step shown in FIG. 10, the terminals P1 and P2 are controlled low at Time t2, as shown in the left part in FIG. 11, the switches SW2 and SW3 shown in FIG. 6 are turned to the ON state, the entire amount of the electric charge charged in the condensers Cx and Cs is discharged, and only a part of the electric charge charged in the condenser Ca is slowly discharged through the resistor R.

Moreover, a process at a fourth step shown in FIG. 10 is run by the process at Step S28, that is, the switches SW1 to SW3 shown in FIG. 6 are turned off. Consequently, electric charge is partially discharged from the condenser Ca at Time t3 through the resistor R from Time t2 to Time t3 (Time t), and then the condensers Ca, Cs and Cx are held in the state that they are charged with the electric charge remaining in the condenser Ca. More specifically, the electric charge charged in the condenser Ca is partially discharged from Time t2 to Time t3, and the charging voltage Va of the condenser Ca is reduced as shown in FIG. 11. Therefore, as described above, when the switches SW1 and SW2 are turned off in the process at the first step, the charging voltage Vx charged in the condenser Cx is to be reduced more than the charging voltage V_hi in accordance with this. However, the ratio between the charging voltages Vs and Vx of the condensers Cs and Cx is maintained as remains constant.

Then, a process at a fifth step shown in FIG. 10 is run by the process at Step S29, that is, the switches SW1 to SW3 shown in FIG. 6 remain off, but the measuring module 13 measures the charging voltage Vx of the condenser Cx through the terminal P2 at Time t4. As long as the measured charging voltage Vx is not smaller than the reference voltage Vref, the processes from Steps S26 to S30, that is, the processes from the third to fifth steps in FIG. 10 are repeated.

More specifically, the processes described above are the processes run from Time T1 (=Time t2) to Time T2 (=Time t5) in FIG. 11. The processes from the third to fifth steps shown in FIG. 10 are repeated, the same processes are repeated from Time T2 to Time T3, from Time T3 to Time T4, from Time T4 to Time T5 and so on, as shown in FIG. 11.

Consequently, every time when the processes from the third to fifth steps are done, the charging voltage of the condenser Ca is reduced as well as the charging voltage of the condenser Cx is reduced.

Then, the capacitance of the condenser Cx can be determined based on the repeated processing number count in the processes from the third to fifth steps until the charging voltage Vx of the condenser Cx drops to the reference voltage Vref.

More specifically, as described above, the sum of the charging voltage Vx of the condenser Cx and the charging voltage Vs of the condenser Cs is the charging voltage Va of the condenser Ca. Thus, when the charging voltage Va of the condenser Ca is reduced by repeating the processes from the third to fifth steps, the charging voltage Vx of the condenser Cx is also continuously reduced as a constant ratio is maintained with the charging voltage Va of the condenser Ca.

Therefore, for example, as shown in FIG. 11, the greater the difference between the charging voltage Vx of the condenser Cx and the reference voltage Vref is, the greater the processing number for the processes from the third to fifth steps in FIG. 10 for reaching the charging voltage Vx of the condenser Cx to the reference voltage Vref is. In reverse, it can be said that the smaller the difference between the charging voltage Vx of the condenser Cx and the reference voltage Vref is, the smaller the processing number for the processes from the third to fifth steps in FIG. 10 for reaching the charging voltage Vx of the condenser Cx to the reference voltage Vref is.

More specifically, in the left part in FIG. 11, the first charging voltage Vx for the charging voltage Vx of the condenser Cx is Vx=V_hi, and the difference from the reference voltage Vref is greater than Vx=V_low that is the first charging voltage Vx for the charging voltage Vx of the condenser Cx in the right part in FIG. 11. Thus, in the left part FIG. 11, the processing number for the processes from the third to fifth steps in FIG. 10 until the charging voltage Vx of the condenser Cx drops to the reference voltage Vref is seven times (Time T1 to Time T8), whereas in the right part in FIG. 11, the processing number for the processes from the third to fifth steps in FIG. 10 until the charging voltage Vx of the condenser Cx drops to the reference voltage Vref is five times (Time T1 to Time T6). The repeated processing number is small.

Figure 12:
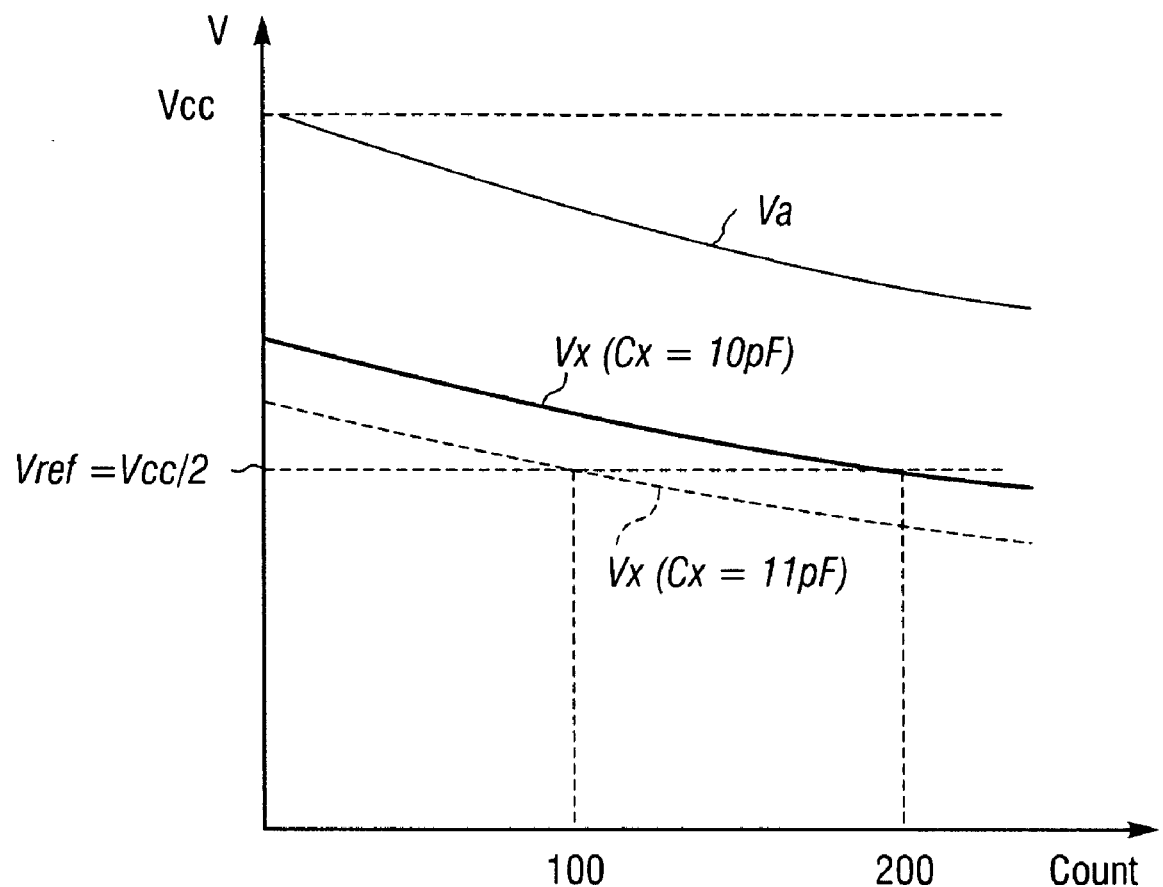
FIG. 12 is a diagram illustrative of a computation method for the unknown capacitance of a condenser.

Consequently, as shown in FIG. 12, the greater capacitance of the condenser Cx (the initial charging voltage Vx of the condenser Cx is lower) can reduce the charging voltage Vx to the reference voltage Vref by a smaller processing number. In FIG. 12, the horizontal axis depicts the processing number count, and the vertical axis depicts the voltage. Furthermore, in FIG. 12, a fine line depicts the charging voltage Va of the condenser Ca, a thick line depicts the variation in the charging voltage Vx when the capacitance of the condenser Cx is 10 pF, and a dotted line depicts the variation in the charging voltage Vx when the capacitance of the condenser Cx is 11 pF. In FIG. 12, when the capacitance of the condenser Cx is 10 pF, it drops to the reference voltage vref (=Vcc/2) by the processing number count of 100 times, whereas when the capacitance of the condenser Cx is 11 pF, it drops to the reference voltage Vref (=Vcc/2) by the processing number count of 200 times. It is shown that the greater capacitance of the condenser Cx drops to the reference voltage Vref by the smaller processing number count. In addition, in FIG. 12, the capacitance of the condenser Cs is 12 pF, the resistor R is 10 kΩ, the capacitance of the condenser Ca is 0.1 μF, and Time t (=Time t (i+1)−Time ti) after Time t1 in FIG. 11 is 2 μS.

More specifically, in the process at Step S34 in the flow chart shown in FIG. 9, the capacitance of the condenser Cx is determined from the repeated processing number count for the processes from the third to fifth steps in FIG. 10, based on this property.

Figure 13:
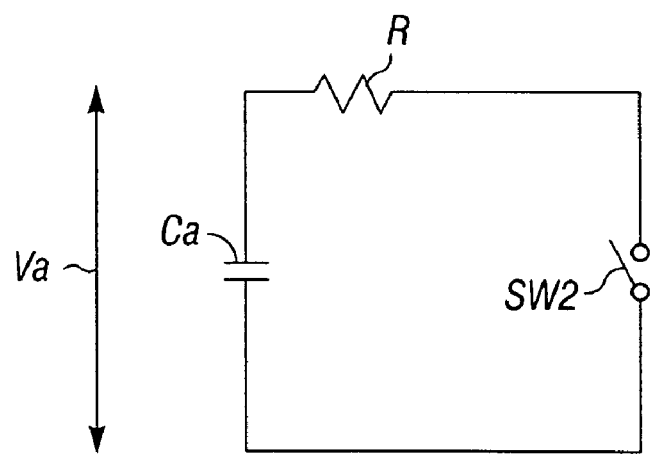
FIG. 13 is a diagram illustrative of the computation method for the unknown capacitance of the condenser.

More specifically, the relationship among the condenser Ca, the resistor R, and the switch SW2 in FIG. 6 can be expressed by a closed circuit shown in FIG. 13. Suppose the condenser Ca is charged at the charging voltage Va=Vc.

Figure 14:
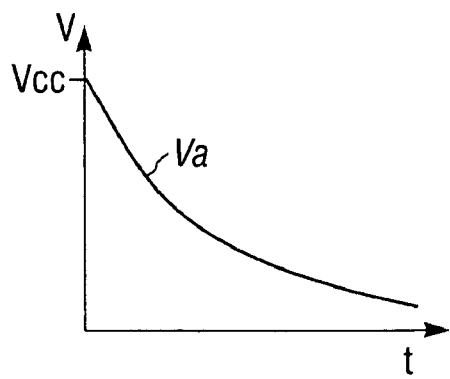
FIG. 14 is a diagram illustrative of the computation method for the unknown capacitance of the condenser.

When the switch SW2 is turned to the ON state, the charging voltage Va of the condenser Ca attenuates as Time t elapses that is the state that the switch remains on, as shown in FIG. 14. The relationship can be expressed by the following Equation (8).

$$Va = Vcc \times e^{(-(\text{ON time of the switch } SW2)/(Ca \times R))} \quad (8)$$

Where, '^' expresses an index. It can be considered that a time period that the switch SW2 remains in the ON state is the repeated processing number count×Time T, when each processing time for the processes from the third to fifth steps in FIG. 10 is constant in Time T. Thus, the Equation (8) is to be expressed by the following Equation (9). More specifically, in FIG. 11, after Time t1, since (Time t (i+1)−Time ti) is Time t, each processing time (a time period that the processes from the third to fifth steps in FIG. 10 are done for one time) is 3t.

$$Va = Vcc \times e^{(-(\text{count} \times 3t)/(Ca \times R))} \quad (9)$$

Figure 15:
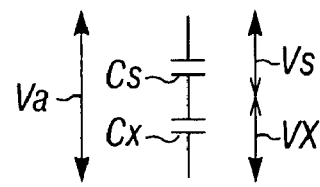
FIG. 15 is a diagram illustrative of the computation method for the unknown capacitance of the condenser.

On the other hand, as shown in FIG. 15, in the process at the fifth step in FIG. 10, since the switches SW1 to SW3 are turned off, the charging voltage Va of the condenser Ca is the sum of the charging voltages Vs and Vx of the condensers Cs and Cx, and the ratio between the charging voltages Vs and Vx is Vs:Vx=1/Cx:1/Cs (here, Cs and Cx is the capacitance of the condensers Cs and Cx).

Therefore, the charging voltage Vx of the condenser Cx is expressed by the following Equation (10).

$$Vx = Vcc((1/Cx)/((1/Cx)+(1/Cs))) \times e^{(-(\text{count} \times 3t)/(Ca \times R))} \quad (10)$$

Consequently, when the charging voltage Vx of the condenser Cx is matched with the reference voltage Vref, the following Equation (11) will be held.

$$Vref = Vcc((1/Cx)/((1/Cx)+(1/Cs))) \times e^{(-(\text{count} \times 3t)/(Ca \times R))} \quad (11)$$

From the relationship above, the capacitance of the condenser Cx will be determined from the following Equation (12).

$$Cx = Cs(1(Vcc/Vref \times e^{(-(\text{count} \times 3t)/(Ca \times R))})) \quad (12)$$

Figure 16:
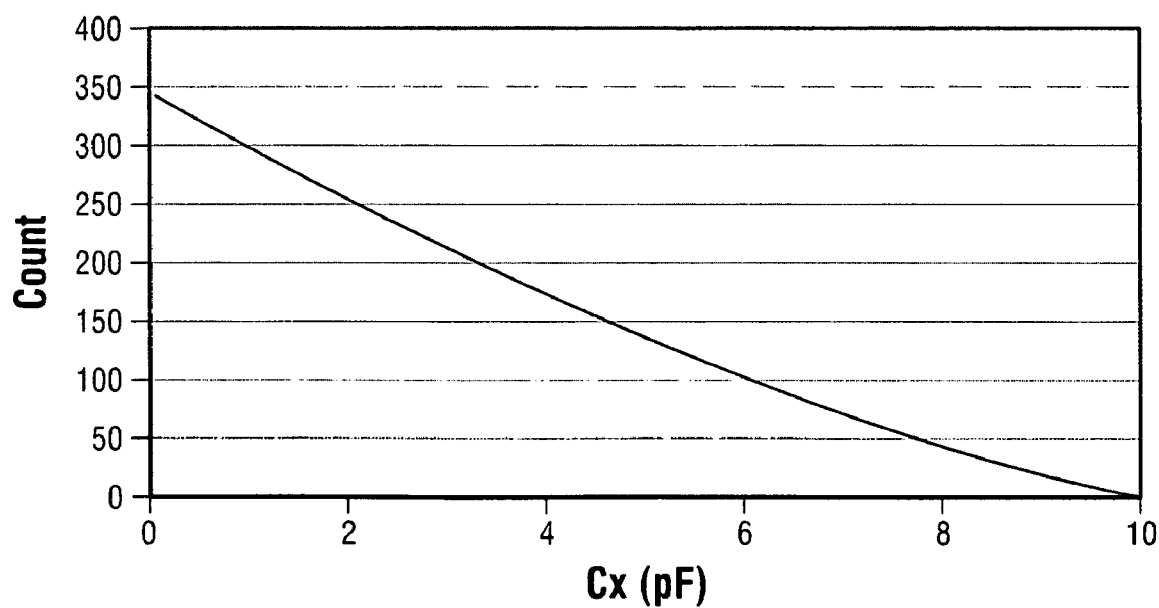
FIG. 16 is a diagram illustrative of the computation method for the unknown capacitance of the condenser.

From Equation (12), for example, when the capacitance of the condenser Cs is 10 pF, the resistor R is 10 kΩ, the capacitance of the condenser Ca is 0.1 μF, and Time t is 2 μS, the relationship between the condenser Cx and the processing number count is the relationship as shown in FIG. 16. In FIG. 16, when the capacitance of the condenser Cx is near 8 pF, the capacitance Cx is determined by the resolving power of about 20 times for the processing number count per pF.

However, in the processes described above, the charging voltage Vx of the condenser Cx is reduced by the repeated processes, and the capacitance of the condenser Cx is determined on the condition that it is matched with the reference voltage Vref by the Equation (12). Therefore, a premise is that the charging voltage Vx of the condenser Cx is greater than the reference voltage Vref in initial charge. Thus, the reference voltage Vref needs to satisfy the following Equation (13).

$$Vref/Vcc < (1/Cs)/((1/Cx)+(1/Cs)) \quad (13)$$

In the processes described above, the resolving power can be improved as Time t (=Time t (i+1)−Time ti) after Time t1 is shorter. However, in reverse, the processing number count is increased as Time t is too short. In the case of the touch sensor (in the case of the touch sensor of the configuration in which the electrode D indirectly touches a human body through an insulator), it is known that the capacitance has the value near 11 pF when a human body touches, and the capacitance has the value near 10 pF when no human body touches. Therefore, when the condition of the Equation (13) is satisfied and the relationship of the following Equation (14) is further satisfied, Time t is shortened to allow high resolving power as well as allow determining the unknown capacitance of the condenser Cx by a smaller processing number.

$$Vref/Vcc \text{ nearly equal to } (1/Cs)/((1/Cx)+(1/Cs)) \quad (14)$$

More specifically, when the reference voltage Vref is set to the value close to the charging voltage Vx of the condenser Cx at the charging voltage Va of the condenser Ca, the repeated processing number can be reduced, and Time t can be shortened by that amount to allow high resolving power.

Consequently, when the unknown capacitance of the condenser is measured in traditional manners, the unknown capacitance of the condenser can be highly accurately determined by a smaller processing number than that in the case where the charging voltage is repeatedly charged from zero by repeating the processes. Therefore, for example, even in the case where the configuration of the electrode D is that a human body indirectly touches an insulator and the variation in the capacitance of the condenser Cx is small (in the case where the variation in the capacitance of the condenser Cx is small when a human body touches or not), the reference voltage Vref and the charging voltage Vcc are set so as to satisfy the relationship of the Equations (13) and (14) in accordance with the variation in the capacitance. Thus, capacitance can be detected highly accurately at high speed.

Furthermore, since the mean value of M times for the processing number n is determined as the processing number count by the processes from Step S31 to S33 in the flow chart shown in FIG. 9, the processing number can be determined accurately even when ripple noise is generated at one measurement, for example. In addition, when whether to generate ripple noise is detected and no ripple noise is then detected, the processing rate may be improved by reducing the repeated processes for the mean value as M is set to one.

Figure 8:
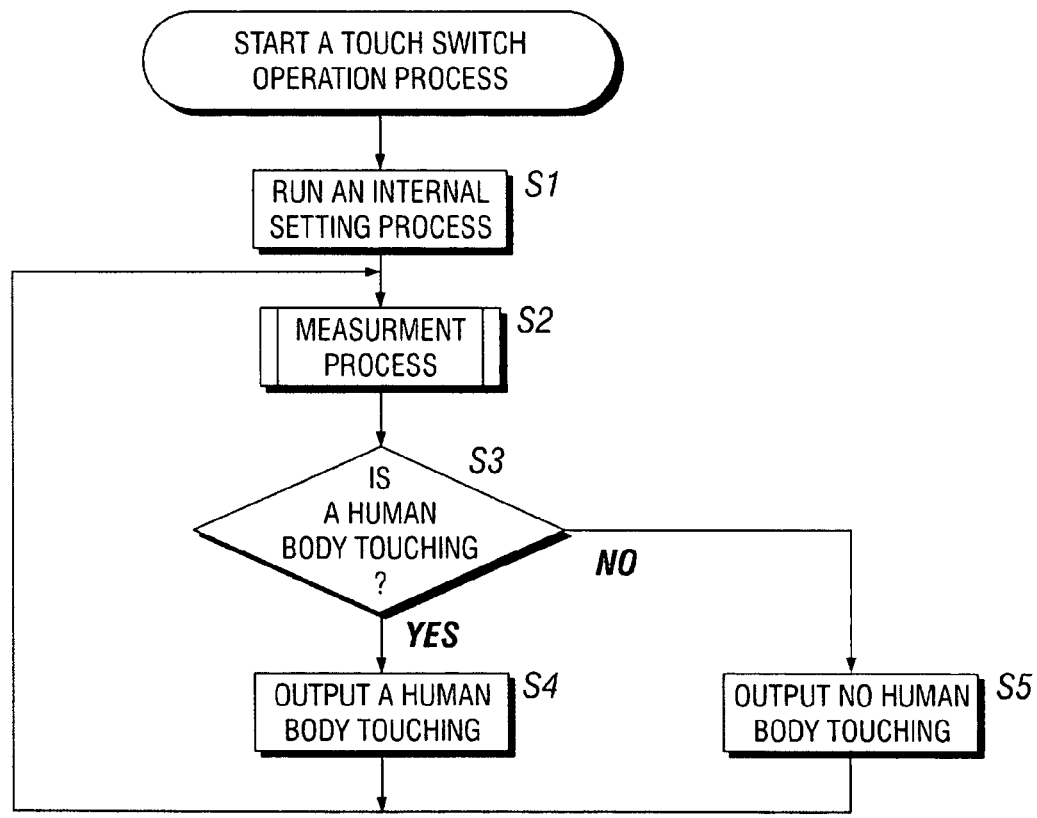
FIG. 8 is a flow chart illustrative of a touch switch operation process by the touch sensor shown in FIG. 5.

Here, return to the description of the flow chart shown in FIG. 8.

At Step S3, the control module 11 determines whether a human body has touched the electrode D based on the unknown capacitance of the condenser Cx supplied from the measuring module 13. More specifically, since the capacitance of a human body is the value near 11 pF, the control module 11 determines whether the capacitance of the condenser Cx supplied from the measuring module 13 is the value near 11 pF, and thus determines whether a human body is touching the electrode D.

At Step S3, when a human body is touching, the control module 11 controls the output module 14 to show that a human body is touching at Step S4, and the process returns to Step S2.

On the other hand, at Step S3, when no human body is touching, the control module 11 controls the output module 14 to show that no human body is touching at Step S5, and the process returns to Step S2 to repeat the processes after that.

As described above, the unknown capacitance of the condenser Cx can be detected by a smaller processing number count highly accurately, and thus whether a human body is touching or not can be recognized accurately at high speed.

In addition, since it is known beforehand that an object to touch is a human body, a proper reference voltage Vref is set beforehand to allow processing at high speed. However, for example, when the capacitance of an object to touch is unknown, the following scheme may be done. Time t is prolonged, that is, the reference voltage Vref is varied in the low resolving power state to detect coarse capacitance. The reference voltage Vref is again set close to the charging voltage Vx of the condenser Cx based on the detected capacitance, and then Time t is shortened for highly accurate detection.

As described above, the example is described that the microcomputer 1 formed of three terminals, the terminals P0 to P2 is used to configure the touch sensor. However, for example, the functions of the terminals P0 and P1 may be combined to one.

More specifically, in the case of the touch sensor shown in FIG. 5, the circuit configuration is in which the switches SW1 and SW2 sandwich the resistor R as shown in FIG. 6, and thus the same terminal cannot conduct control. However, as shown in FIG. 17, the circuit configuration is formed in which the switch SW1 is connected at the opposite position facing to the resistor R, and thus a single terminal can control the switches SW1 and SW2.

Figure 18:
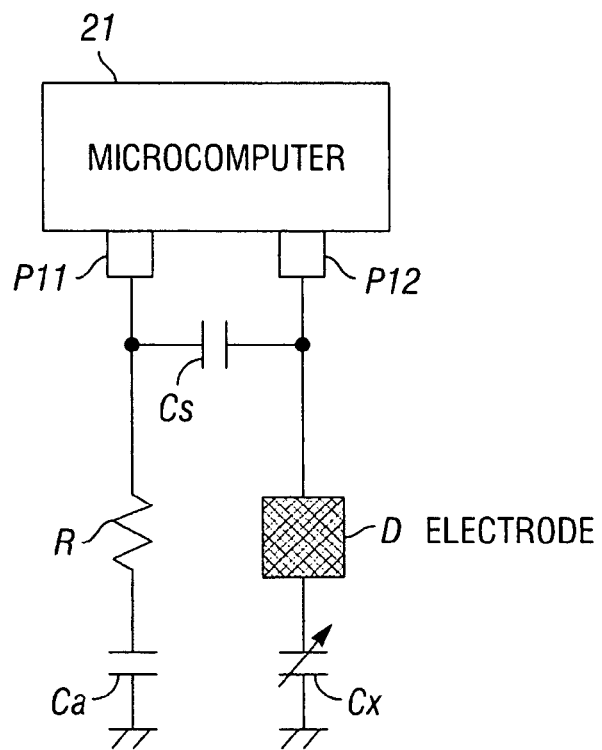
FIG. 18 is a diagram illustrative of the configuration of a touch sensor formed of the circuit configuration shown in FIG. 17.

FIG. 18 depicts the configuration of a touch sensor which controls switches SW1 and SW2 by a single terminal. A microcomputer 21 is disposed with two terminals, terminals P11 and P12. The function of the terminal P12 is the same as that of the terminal P2 of the microcomputer, shown in FIG. 5, but the terminal P11 shown in FIG. 18 has the functions of the terminals P0 and P1 shown in FIG. 5. In addition, in FIG. 18, for the same configuration as that in FIG. 5, the same numerals and signs are assigned, omitting the description properly.

Figure 17:
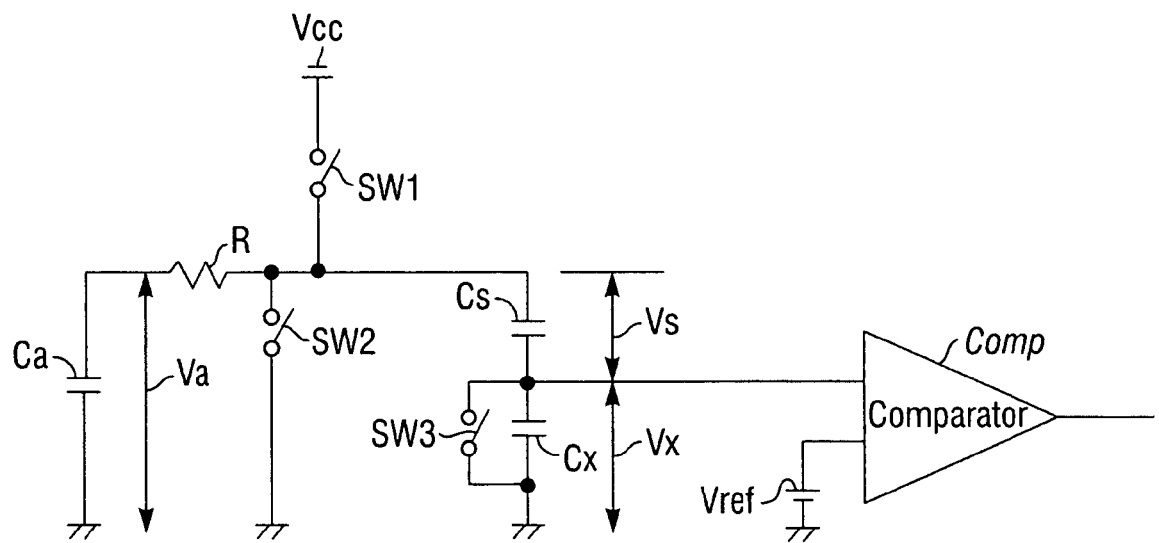
FIG. 17 is a circuit diagram illustrative of another configuration of a touch sensor.

When the terminal P11 is turned to the high state by a switch operating module 31, it turns the switch SW1 in FIG. 17 to the ON state to charge the condenser Ca at the power supply voltage Vcc of the power supply Vcc. Furthermore, when the terminal P11 is turned to the HiZ state by the switch operating module 31, it turns the switches SW1 and SW2 shown in FIG. 17 to the OFF state, turns the switch SW2 shown in FIG. 6 to the OFF state, and turns the condenser Ca to the state that it is connected in parallel with the combined condenser of the condensers Cs and Cx. Moreover, when the terminal P11 is turned to the low state by the switch operating module 31, it turns the switch SW2 shown in FIG. 17 to the ON state, gradually discharges the electric charge charged in the condenser Ca from the ground point through the resistor R, and instantaneously discharges the entire amount of electric charge charged in the condenser Cs from the ground point. In addition, the terminal P12 is the same as the terminal P2 in FIG. 5, omitting the description.

Next, the function implemented by the microcomputer 21 shown in FIG. 18 will be described with reference to FIG. 19. In addition, in FIG. 19, for the function corresponding to the function implemented by the microcomputer 1 shown in FIG. 7, the same numerals and signs are assigned, omitting the description properly.

The switch operating module 31 basically has the same function as that of the switch operating module 12 shown in FIG. 7, which controls the operation of the terminals P11 and P12 at every predetermined time interval with reference to Timer 31a incorporated therein. More specifically, the switch operating module 31 periodically switches the operation states of the terminals P11 and P12 in a predetermined pattern at every predetermined time interval. Furthermore, the switch operating module 31 supplies its signal to a measuring module 13 at every time when one cycle of the operation repeated in a predetermined pattern is finished.

Next, a touch switch operation process by the touch sensor shown in FIG. 18 will be described. However, since only the measurement process at Step S2 is different among the processes described with reference to the flow chart in FIG. 8, only a measurement process by the touch sensor shown in FIG. 18 will be described with reference to a flow chart shown in FIG. 20.

Figure 20:
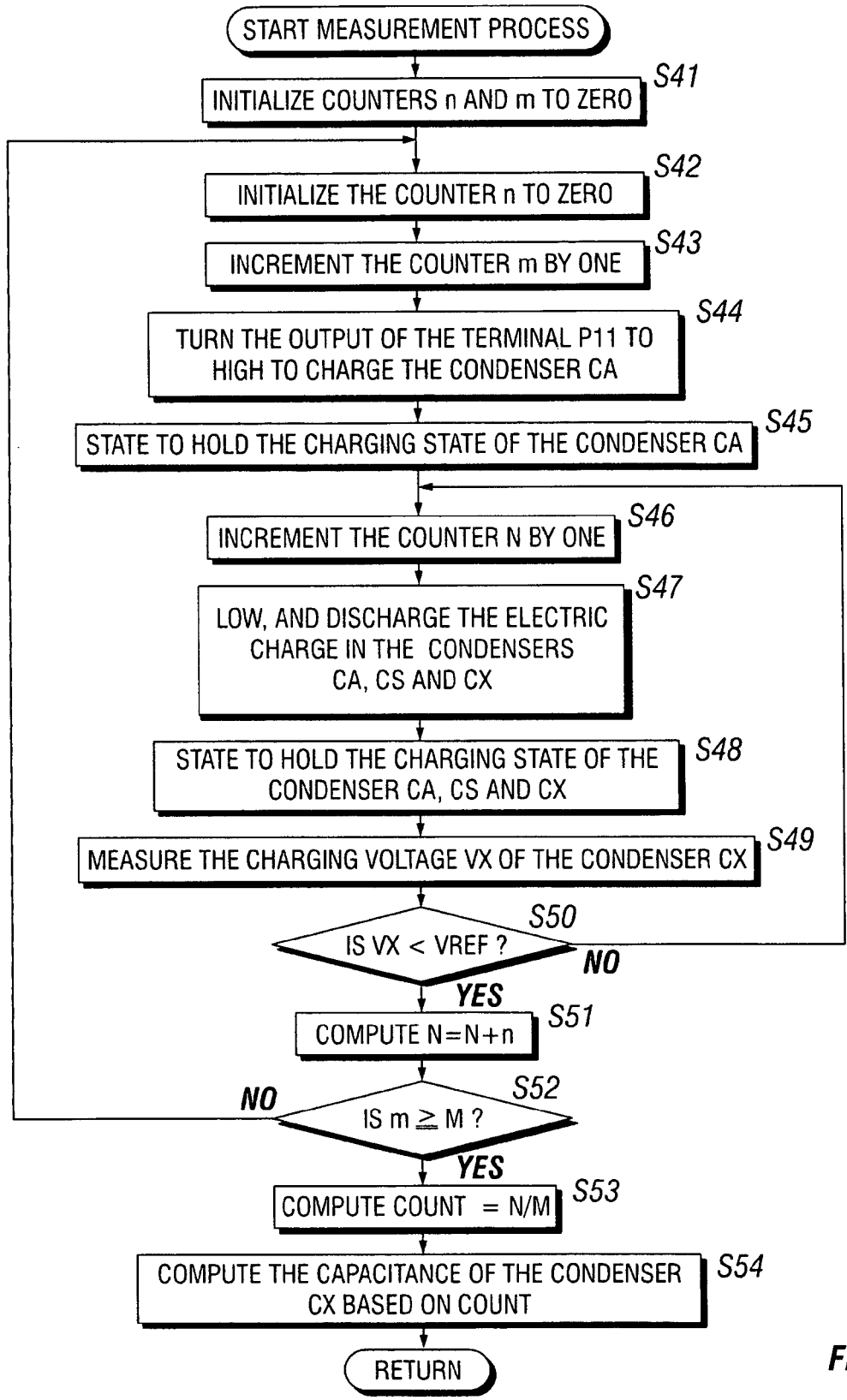
FIG. 20 is a flow chart illustrative of a measurement process by the touch sensor shown in FIG. 18.

In addition, for processes from Steps S41 to S43 and from Steps S49 to S54 in FIG. 20, they are the same as the processes from Steps S21 to S23 and from Steps S29 to S34 described with reference to the flow chart shown in FIG. 9, omitting the description.

At Step S44, the switch operating module 31 controls the output of the terminal P11 to high, and charges the condenser Ca by the power supply Vcc. More specifically, the output of the terminal P11 is controlled high, and then the switch SW1 shown in FIG. 17 is turned to the ON state. Electric power is supplied to the condenser Ca from the power supply Vcc through the resistor R, the condenser Ca is gradually charged, and the condenser Ca is finally charged at the charging voltage Vcc.

At Step S45, the switch operating module 31 controls all the terminals P11 and P12 to HiZ (high impedance state) only for a predetermined time period t based on Timer 31a, and holds the charging state of the condenser Ca. More specifically, the terminals P11 and P12 are controlled to the HiZ state, the switches SW1 to SW3 shown in FIG. 17 are turned to the OFF state, and thus the condenser Ca is held in the state it is charged at the charging voltage Va=Vcc.

At Step S46, a counter 13a of the measuring module 13 increments counter n by one.

At Step S47, the switch operating module 31 controls the terminals P11 and P12 low only for a predetermined time period t based on the Timer 31a, and discharges the electric charge charged in condensers Ca, Cs and Cx. At this time, the electric charge charged in the condensers Cs and Cx is instantaneously discharged through a ground part, but the electric charge charged in the condenser Ca is discharged to the ground part by the switch SW2 through resistor R. Therefore, discharging the electric charge slowly proceeds, and thus only a part of the electric charge charged within a predetermined time period t is discharged.

At Step S48, the switch operating module 31 controls the terminals P11 and P12 to the HiZ state only for a predetermined time period t based on the Timer 31a, it transfers the electric charge charged in the condenser Ca (the electric charge remaining in the state partially discharged by the process at Step S47) to the condensers Cs and Cx, and the condensers Ca, Cs and Cx are held in the charged state. At this time, since the condenser Ca and the combined condenser of the condensers Cs and Cx form a parallel circuit, the charging voltage Va of the condenser Ca is in the state it is equal to the sum of the charging voltages Vs and Vc of the condensers Cs and Cx. Furthermore, the charging voltage Vs and the charging voltage Vx of the condensers Cs and Cx have the relationship of reciprocal proportion to the capacitance of the condensers Cs and Cx.

Figures 19, 21:
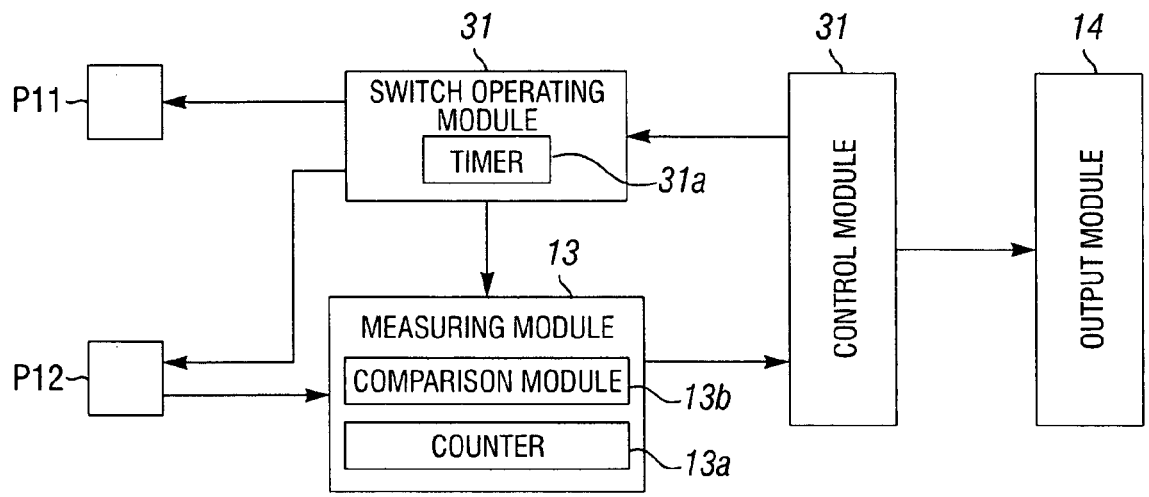
FIG. 19 is a diagram illustrative of the function implemented by a microcomputer shown in FIG. 18.
FIG. 21 is a diagram illustrative of the measurement process by the touch sensor shown in FIG. 18.
Figure 22:
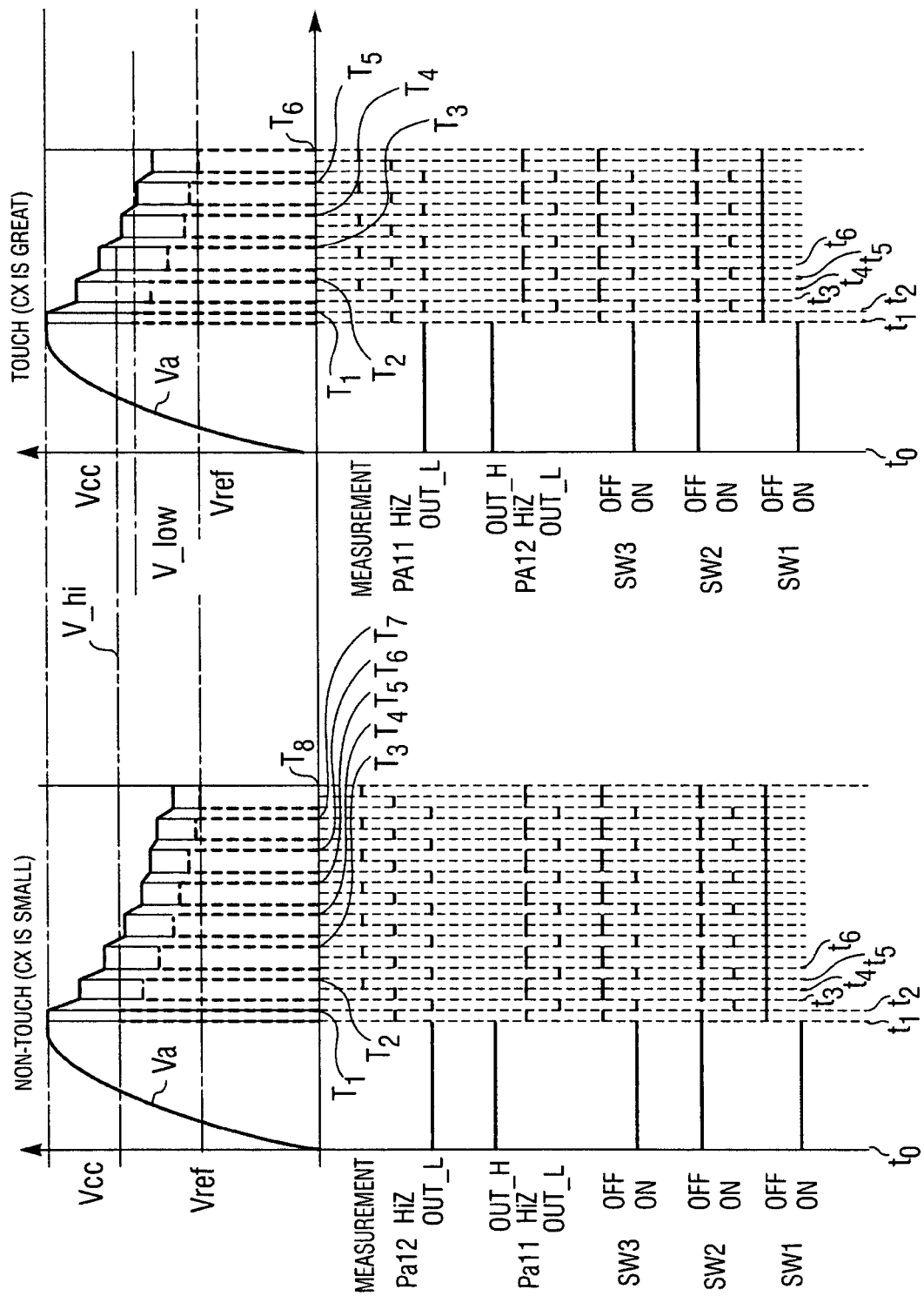
FIG. 22 is a timing chart illustrative of the measurement process by the touch sensor shown in FIG. 18.

Consequently, a process at a first step shown in FIG. 21 is run by the process at Step S44, that is, the switch SW1 shown in FIG. 17 is turned to the ON state. Since this process is the process that the condenser Ca is simply charged, the switch SW2 may be OFF, and the SW3 may be ON or OFF. Consequently, the terminal P11 is controlled high in the process at the first step in FIG. 21 at Time t0, as shown in the left part in FIG. 22, the switch SW1 shown in FIG. 17 is turned to the ON state, and then the condenser Ca is charged at the charging voltage Va=Vcc. However, as revealed from comparison with FIG. 11, in the touch sensor shown in FIG. 5, the switch SW1 is turned on, and then the charging voltage Va of the condenser Ca simultaneously reaches Vcc. As shown in FIG. 22, in the touch sensor shown in FIG. 18, electric power supplied from the power supply Vcc to the condenser Ca is supplied through the resistor R, and thus charging takes time.

In addition, in the upper graph shown in FIG. 22, a thick solid line depicts the charging voltage Va of the condenser Ca, and a dotted line depicts the charging voltage of the condenser Cx. Furthermore, the operation state of the terminal P12 is shown therebelow, where measurement expresses the state that the condenser Cx is measured by the measuring module 13 through the terminal P12, HiZ expresses the high impedance state, that is, the state that the terminal P12 does no output, and OUT_L expresses the state set low.

The operation state of the terminal P11 is shown below the terminal P12, where Hi expresses the state that the condenser Ca is supplied with electric power by the power supply Vcc through the terminal P11 and is charged at the charging voltage Vcc. HiZ expresses the high impedance state, that is, the state that the terminal P11 does no output, and OUT_L expresses the state set low.

Moreover, the operation states of the switch SW3 to SW1 are individually shown therebelow. In addition, the operation of the switch SW1 is done together with the terminal P11; it is turned to the ON state when the terminal P11 is set to high, it is turned to the OFF state when the terminal P11 is HiZ. When the terminal P11 is set low, the switch SW2 is turned to the ON state. In this manner, only the terminal P11 can control the switches SW1 and SW2. The operation of the switch SW3 is done together with the terminal P12; it is turned to the ON state only when the terminal P12 is set low, and it is in the OFF state other than that.

Furthermore, a process at a second step shown in FIG. 21 is run by the process at Step S45, that is, the switches SW1 to SW2 shown in FIG. 17 are turned to the OFF state. Consequently, the terminals P11 and P12 are controlled to HiZ at Time t1 in the process at the second step in FIG. 21, as shown in the left part in FIG. 22, the switches SW1 to SW3 in FIG. 17 are turned to the OFF state, and the condenser Ca remains in the state it is charged at the charging voltage Va=Vcc.

Then, a process at a third step shown in FIG. 21 is run by the process at Step S47, that is, the switch SW1 in FIG. 17 is turned off, and the switches SW2 and SW3 are turned on. Consequently, the terminal P11 is controlled low at Time t2 in the process at the third step in FIG. 21, as shown in the left part in FIG. 21, the switches SW2 and SW3 in FIG. 17 are turned to the ON state. The entire amount of the electric charge charged in the condensers Cx and Cs are discharged as well as the electric charge charged in the condenser Ca is slowly discharged through the resistor R.

Moreover, a process at a fourth step shown in FIG. 21 is run by the process at Step S48, that is, the process that the switches SW1 to SW3 in FIG. 17 are turned off. Consequently, the electric charge is partially discharged from the condenser Ca at Time t3 through the resistor R from Time t2 to Time t3, and then the condensers Ca, Cs and Cx are maintained in the state that they are charged with the electric charge remaining in the condenser Ca. More specifically, the electric charge charged in the condenser Ca is partially discharged from Time t2 to Time t3, and thus the charging voltage Va of the condenser Ca is reduced as shown in FIG. 22. Therefore, as described above, when the switches SW1 and SW2 are turned off in the process at the first step in FIG. 21, the charging voltage Vx=V_hi charged in the condenser Cx is also reduced. However, the ratio between the charging voltages Vs and Vx of the condensers Cs and Cx is maintained as constant.

Then, a process at a fifth step shown in FIG. 21 is run by the process at Step S49. More specifically, the switches SW1 to SW3 in FIG. 17 remain off, but the measuring module 13 measures the charging voltage Vx of the condenser Cx at Time t4 through the terminal P12. As long as the measured charging voltage Vx is not smaller than the reference voltage Vref, the processes from Steps S46 to S50, that is, the processes from the third to fifth steps in FIG. 21 are repeated.

Consequently, as similar to the touch sensor shown in FIG. 5, the touch sensor shown in FIG. 18 can detect a human body touching or not highly accurately at high speed as well as can curtail fabrication cost because the microcomputer 21 needs to control two terminals.

In addition, as shown in FIG. 22, it is also the same in the touch sensor shown in FIG. 18 that the repeated processing number is small in the case where the charging voltage Vx of the condenser Cx has the value close to the reference voltage Vref when the charging voltage Va of the condenser Ca is Va=Vcc. More specifically, it is shown in the left part FIG. 22 that the charging voltage Vx of the condenser Cx is V_hi, the repeated processing number is seven times, and the charging voltage Vx reaches the reference voltage Vref when the charging voltage Va of the condenser Ca is Va=Vcc, whereas it is shown in the right part in FIG. 22 that the charging voltage Vx of the condenser Cx is V_low (<V_hi), the repeated processing number is five times, the charging voltage Vx reaches the reference voltage Vref when the charging voltage Va of the condenser Ca is Va=Vcc, and that the charging voltage Vx of the condenser Cx is small when the charging voltage Va of the condenser Ca is Va=Vcc, and the repeated processing number is smaller as closer to the reference voltage Vref.

As described above, the example is described that a single electrode D determines whether a human body is touching (touching through an insulator), but a plurality of the configurations of the touch sensor shown in FIG. 18 may be disposed in which multiple electrodes are used to detect whether a human body touching or not at multiple positions.

Figure 23:
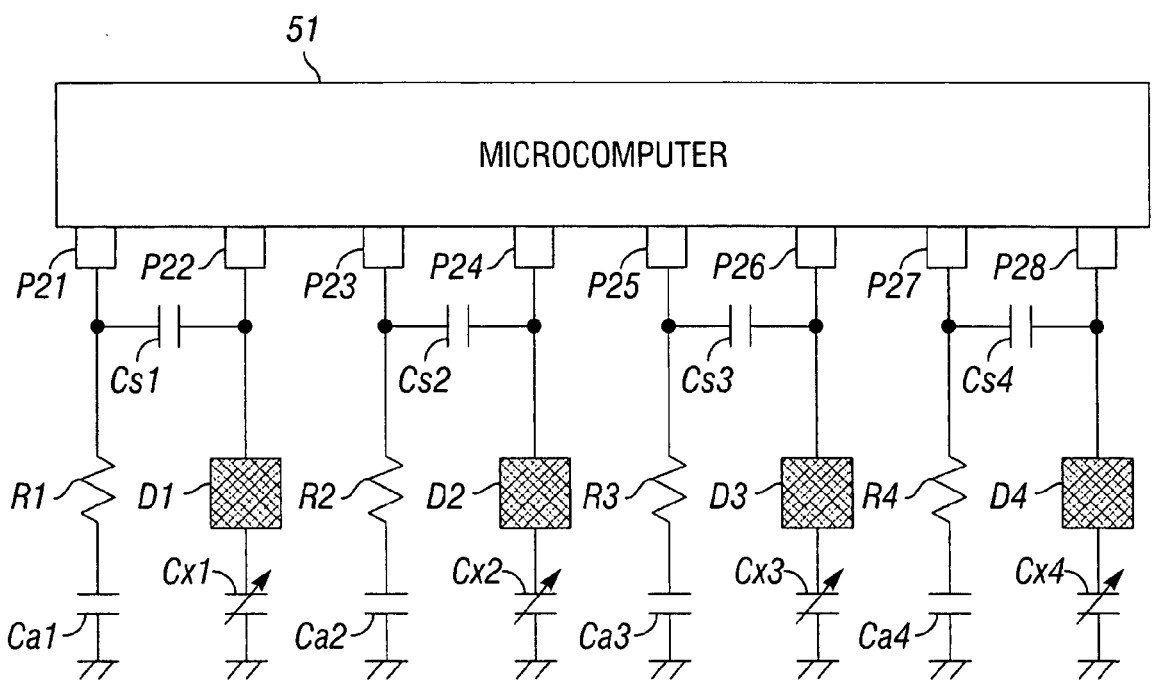
FIG. 23 is a diagram illustrative of still another configuration of a touch sensor.

For example, as shown in FIG. 23, it may be detected by the configuration in which four electrodes D1 to D4 are disposed in parallel. In addition, in FIG. 23, condensers Ca1 to Ca4 correspond to the condenser Ca in FIG. 18, condensers Cs1 to Cs4 correspond to the condenser Cs in FIG. 18, condensers Cx1 to Cx4 correspond to the condenser Cx in FIG. 18, resistors R1 to R4 correspond to the resistor R in FIG. 18, the electrodes D1 to D4 correspond to the electrode D in FIG. 18, each is the same. Furthermore, in association with this, a microcomputer 51 is disposed with eight terminal P21 to P28; the terminals P21, P23, P25 and P27 correspond to the terminal 11, and the terminals P22, P24, P26, and P28 correspond to the terminal 12, each is the same. The microcomputer 51 uses the terminals P21 and P22 to determine whether a human body is touching or not to the electrode D1, uses the terminals P23 and P24 to determine whether a human body is touching or not to the electrode D2, uses the terminals P25 and P26 to determine whether a human body is touching or not to the electrode D3, and uses the terminals P27 and P28 to determine whether a human body is touching or not to the electrode D4.

However, the microcomputer 51 does not determine the charging voltages Vx1 to Vx4 of the condensers Cx1 to Cx4 measured by the terminals P22, P24, P26, and P28 at the same time. For example, it uses the terminals P21 and P22 to determine whether a human body is touching or not to the electrode D1, uses the terminals P23 and P24 to determine whether a human body is touching or not to the electrode D2, uses the terminals P25 and P26 to determine whether a human body is touching or not to the electrode D3, and then uses the terminals P27 and P28 to determine whether a human body is touching or not to the electrode D4. Then, this process is sequentially repeated, and whether a human body touching or not to the electrode D1 to D4 is in turn detected.

At this time, as described above, since the condenser Ca1 to Ca4 all take time for charging because of the resistors R1 to R4, it is likely that when charge is started after the capacitance of each of the condensers Ca1 to Ca4, waiting time for charge is generated to prolong processing time.

Figure 24:
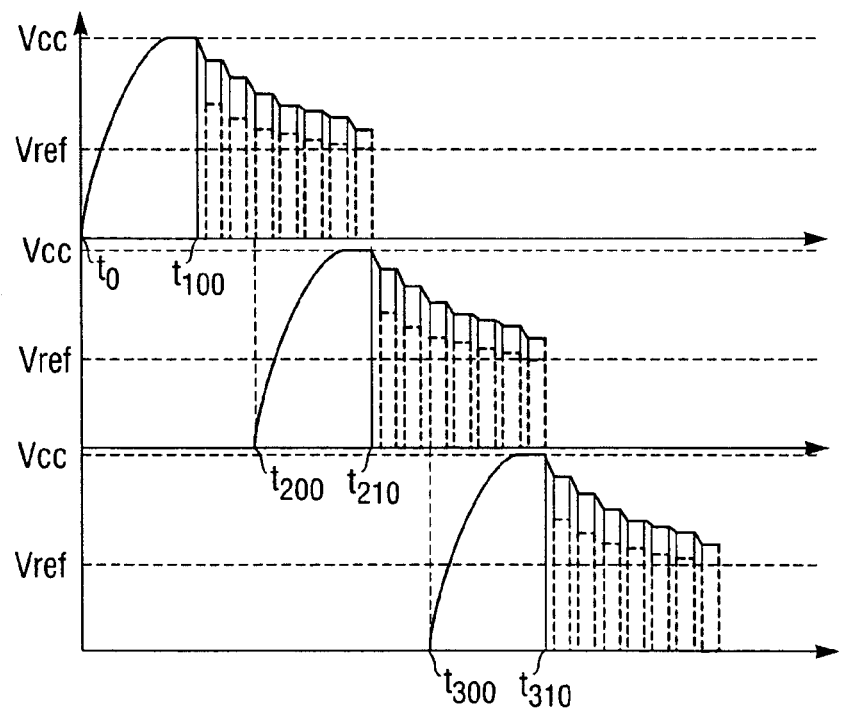
FIG. 24 is a diagram illustrative of the operation of the touch sensor in FIG. 23.

Then, as shown in FIG. 24, charging the condenser Ca that capacitance is to be determined may be started during computation of capacitance. More specifically, for example, as shown in the upper part in FIG. 24, the microcomputer 51 uses the terminals P21 and P22 to charge the condenser Ca1 from Time T0 to Time T100, and starts the process to repeat the processes from the third to fifth steps in FIG. 21 at Time T100. At this time, in order to determine the capacitance of the condenser Cx2 after Time t100, the microcomputer 51 uses the terminals P23 and P24 to start charging the condenser Ca2 at Time t200, for example, when it enters the process to repeat the processes from the third to fifth steps in FIG. 21, as shown in the middle in FIG. 24. Subsequently, since charging the condenser Ca2 is completed at Time t210 when the capacitance of the condenser Cx1 is determined, the microcomputer 51 enters the process to repeat the processes from the third to fifth steps in FIG. 21, in order to determine the capacitance of the condenser Cx2. Similarly, in order to determine the capacitance of the condenser Cx3, the microcomputer 51 uses the terminals P25 and P26 to start charging the condenser Ca3 at Time t300, for example, when it enters the process to repeat the processes from the third to fifth steps in FIG. 21. Then, since charging the condenser Ca3 is completed at Time t310 when the capacitance of the condenser Cx2 is determined, the microcomputer 51 enters the process to repeat the processes from the third to fifth steps in FIG. 21, in order to determine the capacitance of the condenser Cx3.

In this manner, in order to determine the capacitance of the condensers Cx1 to Cx4, charging the condensers Ca1 to Ca4 corresponding to the electrode to be next processed is conducted at timing that the microprocessor enters the process to repeat the processes from the third to fifth steps in FIG. 21. Therefore, waiting time caused by charging can be shortened, and thus whether a human body is touching or not can be detected highly accurately at high speed even when whether a human body is touching or not is detected at multiple positions.

Figure 25:
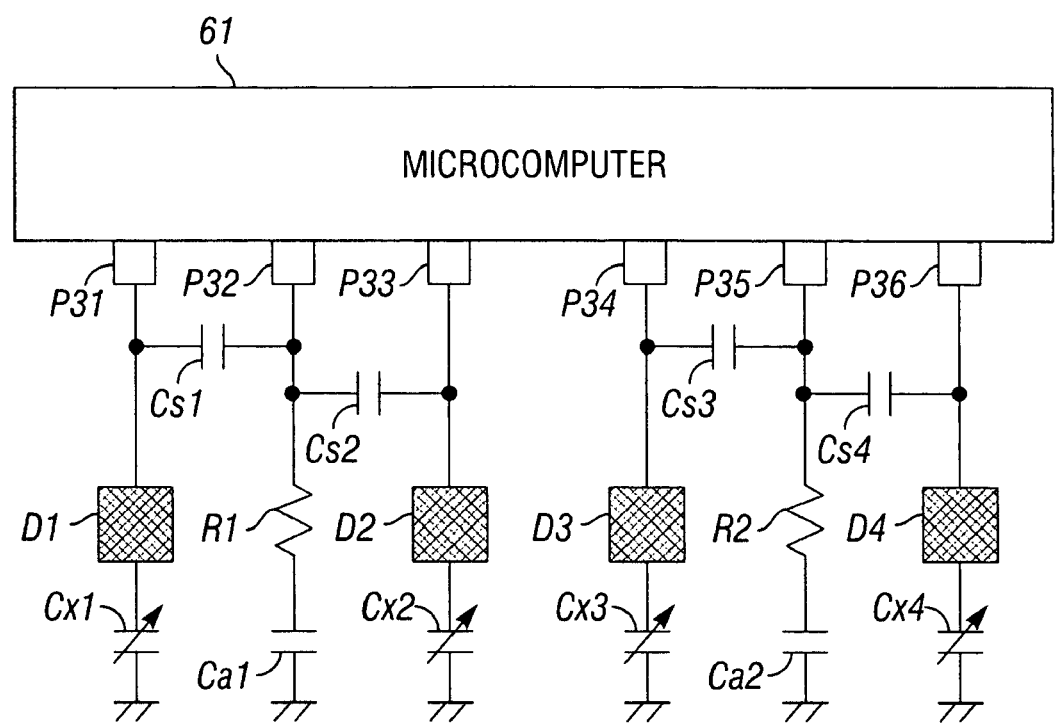
FIG. 25 is a diagram illustrative of yet another configuration of a touch sensor.

Furthermore, as described above, the microcomputer does not conduct the process using three terminals or more at the same time even though there are multiple terminals. Moreover, since the condenser Ca and the resistor R are first charged, and then the charged electric charge is discharged by repeating the processes. Thus, the condenser Ca and the resistor R may be connected in parallel to multiple condensers Cs and Cx and electrodes D. Therefore, for example, as shown in FIG. 25, a scheme may be done; terminal P32 formed of condenser Ca1 and resistor R1 is connected in parallel to terminal P31 for condensers Cs1 and Cx1 to detect whether a human body is touching or not to electrode D1 and to terminal P33 for condensers Cs2 and Cx2 to detect whether a human body is touching or not to electrode D2. Furthermore, terminal P35 formed of condenser Ca2 and resistor R2 is connected in parallel to terminal P34 for condensers Cs3 and Cx3 to detect whether a human body is touching or not to electrode D3, and to terminal P36 for condensers Cs4 and Cx4 to detect whether a human body is touching or not to electrode D4.

In the case of the touch sensor shown in FIG. 25, a microcomputer 61 controls the terminals P31 and P32 to determine whether a human body is touching or not to the electrode D1, it controls the terminals P32 and P33 to determine whether a human body is touching or not to electrode D2, it controls the terminals P34 and P35 to determine whether a human body is touching or not to the electrode D3, and it controls the terminals P35 and P36 to determine whether a human body is touching or not to the electrode D4.

Consequently, since the microcomputer 61 can control a touch sensor which detects whether a human body is touching or not at four positions by six terminals, fabrication cost of the touch sensor can be curtailed.

Figure 26:
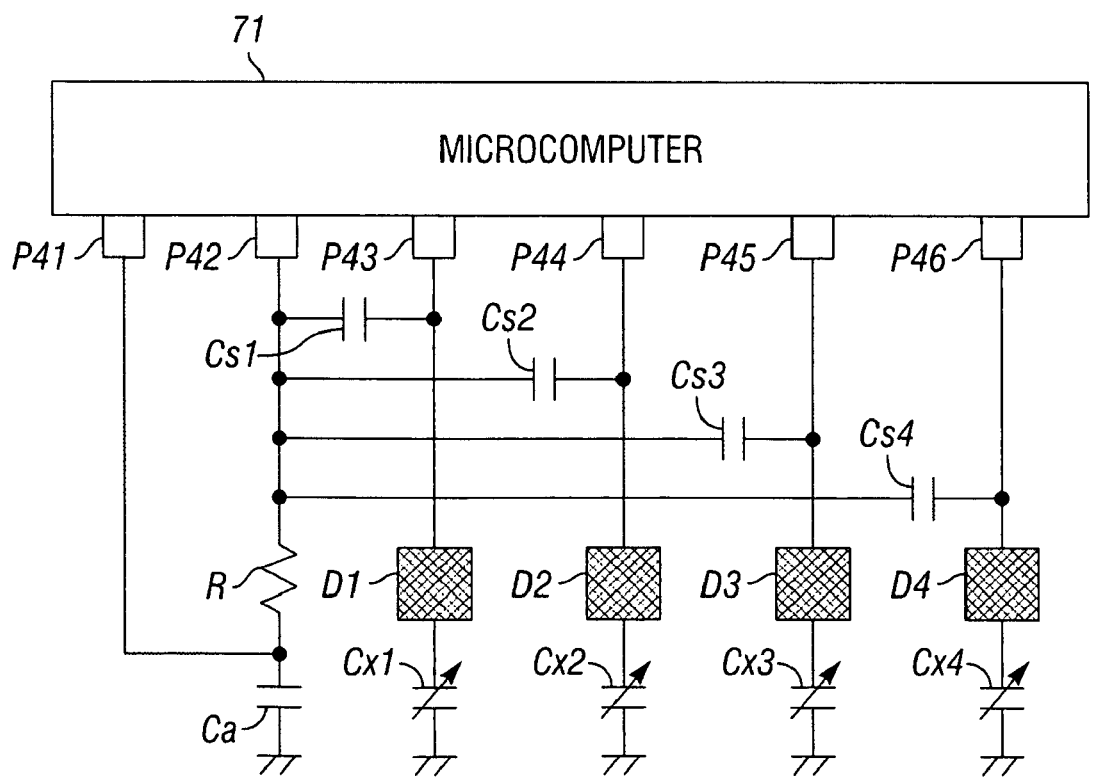
FIG. 26 is a diagram illustrative of still yet another configuration of a touch sensor.

Furthermore, the touch sensor which detects whether multiple human bodies are touching or not is not limited to have the configuration of the touch sensor shown in FIG. 18. For example, it can also be implemented by the configuration of the touch sensor shown in FIG. 5. For example, it may be configured of the form as shown in FIG. 26. In a touch sensor shown in FIG. 26, terminal P41 corresponding to the terminal P0 in FIG. 5, terminal P42 corresponding to the terminal P1, resistor R, and condenser Ca is disposed, and four terminals corresponding to the terminal P2 are disposed in parallel. More specifically, the terminal P43 is connected to condensers Cs1 and Cx1 which detect whether a human body is touching or not to electrode D1, the terminal P44 is connected to condensers Cs2 and Cx2 which detect whether a human body is touching or not to the electrode D2, the terminal P45 is connected to condensers Cs3 and Cx3 which detect whether a human body is touching or not to the electrode D3, and the terminal P46 is connected to condensers Cs4 and Cx4 which detect whether a human body is touching or not to electrode D4.

In the case of the touch sensor shown in FIG. 26, a microcomputer 71 controls the terminals P41 to P43 to determine whether a human body is touching or not to the electrode D1, it controls the terminals P41, P42 and P44 to determine whether a human body is touching or not to electrode D2, it controls the terminals P41, P42 and P45 to determine whether a human body is touching or not to the electrode D3, and it controls the terminals P41, P42 and P46 to determine whether a human body is touching or not to the electrode D4.

As described above, consequently, the microcomputer 71 can control the touch sensor which detects whether a human body is touching or not at four positions by six terminals.

In addition, in the description above, the example is described that the unknown capacitance of the condenser Cx is measured to determine whether a human body touching or not. However, a touch sensor that can measure capacitance based on the variation may be applied to other pieces of measuring apparatus. For example, a pressure sensor which measures pressure by measuring capacitance may be configured by disposing a configuration in which an interval between electrodes is varied in accordance with pressure to vary capacitance.

As described above, unknown capacitance can be measured by an inexpensive apparatus highly accurately at high speed as well as whether a human body is touching or not can be determined highly accurately at high speed based on the measurement result of capacitance.

Although a series of processes described above can be implemented by hardware, the processes can also be implemented by software. When the series of processes is implemented by software, it is implemented by a computer in which a program configuring that software is installed in hardware for exclusive use, or by installing the program from a recording medium into a multi-purpose personal computer that can run various functions by installing various programs, for example.

Figure 27:
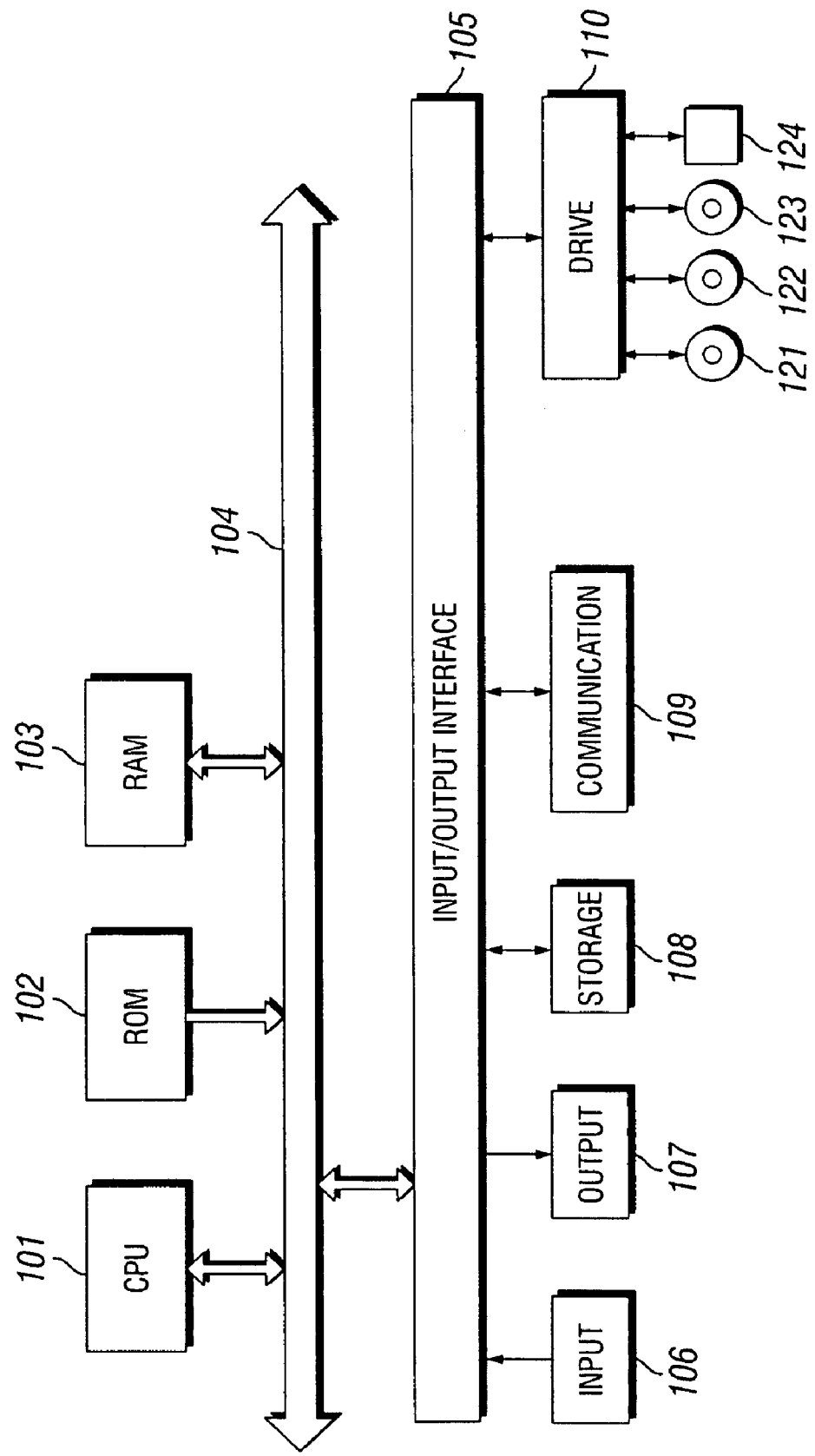
FIG. 27 is a diagram illustrative of a recording medium.

FIG. 27 depicts the configuration of an embodiment of a personal computer when the electrical internal configuration of the microcomputers 1, 21, 51, 61, and 71 in FIGS. 5, 18, 23, 25, and 26 are implemented by software. CPU 101 of the personal computer controls the entire operation of the personal computer. Furthermore, when an instruction is inputted by a user from an input module 106 formed of a keyboard and a mouse through a bus 104 and an input/output interface 105, the CPU 101 runs a program stored in ROM (Read Only Memory) 102 in association therewith. Alternatively, the CPU 101 loads a program read out of a magnetic disk 121, an optical disk 122, a magneto-optical disk 123, or semiconductor memory 124 connected to drive 110 and installed in a storage module 108 in RAM (Random Access Memory) 103 for execution. Thus, the function of the microcomputers 1, 21, 51, 61, and 71 in FIGS. 5, 18, 23, 25, and 26 are implemented by software. Moreover, the CPU 101 controls a communication module 109 to communicate with external devices to send and receive data.

As shown in FIG. 27, in addition to the computer, a recording medium on which the program is recorded is configured of the magnetic disk 121 (including a flexible disk), the optical disk 122 (including CD-ROM (Compact Disc-Read Only Memory), and DVD (Digital Versatile Disk)), and the magneto-optical disk 123 (including MD (Mini-Disc)), or a packaged medium such as semiconductor memory 124, on which the program is recorded for distribution for users, as well as configured of the ROM 102 on which the program is recorded for users as it is installed beforehand in a computer and hard disk drive included in the storage module 108.

In addition, in the specification, steps of describing the program recorded in the recording medium of course include processes done in a time series along the described order and also include processes that are done in parallel or individually not necessarily in a time series.

What is claimed is:

1. A capacitance measuring apparatus including a circuit in which a first capacitor formed of known capacitance is serially connected to a second capacitor formed of unknown capacitance and the circuit having one end part grounded, the circuit measuring capacitance of the second capacitor, the apparatus comprising:
- a third capacitor which has one end part thereof connected to the other end part of the circuit and the other end part thereof grounded, and applies charging voltage thereof to the other end part of the circuit to charge the first capacitor and the second capacitor with electric charge;
- a first discharging module which partially discharges the electric charge charged in the third capacitor, and discharges the entire electric charge charged in the first capacitor;
- a second discharging module which discharges the entire electric charge charged in the second capacitor at almost the same timing as the first discharging module;
- a number counting module which counts numbers of discharges of the first discharging module and the second discharging module;
- a comparison module which compares charging voltage of the second capacitor with reference voltage;
- a computing module which computes capacitance of the second capacitor, when discharge of the first discharging module and the second discharging module is repeated, at a time when the charging voltage of the second capacitor is matched with the reference voltage or when the charging voltage of the second capacitor is smaller than the reference voltage from the compared result of the comparison module, based on the number of discharges counted by the number counting module.

2. The capacitance measuring apparatus according to claim 1, wherein the first discharging module partially discharges the electric charge charged in the third capacitor by discharging the electric charge charged in the third capacitor only for a predetermined time period through a resistor serially connected to the third capacitor.

3. The capacitance measuring apparatus according to claim 2 further comprising a charging module which charges the third capacitor at a predetermined charging voltage, wherein the charging module directly charges the third capacitor.

4. The capacitance measuring apparatus according to claim 2 further comprising a charging module which charges the third capacitor at a predetermined charging voltage, wherein the first discharging module has one end part thereof grounded and the other end part thereof connected between the circuit and the resistor, and the charging module charges the third capacitor from a same position as the other end part of the first discharging module.

5. The capacitance measuring apparatus according to claim 1, wherein the second capacitor further comprises an electrode, and the electrode is directly or indirectly touched by a human body through an insulator.

6. A capacitance measuring method of a capacitance measuring apparatus including: a circuit in which a first capacitor formed of known capacitance is serially connected to a second capacitor formed of unknown capacitance and the circuit having one end part grounded; and a third capacitor which has one end part thereof connected to the other end part of the circuit and the other end part thereof grounded, and applies charging voltage thereof to the other end part of the circuit to charge the first capacitor and the second capacitor with electric charge, the capacitance measuring method comprising:
- a first discharge step of partially discharging electric charge charged in the third capacitor and discharging the entire electric charge charged in the first capacitor;
- a second discharge step of discharging the entire electric charge charged in the second capacitor at almost the same timing as the process at the first discharge step;
- a number measuring step of counting numbers of discharges in the processes at the first discharge step and the second discharge step;
- a comparing step of comparing charging voltage of the second capacitor with reference voltage;
- a computing step of computing capacitance of the second capacitor, when discharge in the processes at the first discharge step and the second discharge step is repeated, at a time when the charging voltage of the second capacitor is matched with the reference voltage or when it becomes smaller than the reference voltage from the compared result in the process at the comparing step, based on the number of discharges counted in the process at the number measuring step; and
- an outputting step of outputting the capacitance of the second capacitor to a control module.

7. A computer readable medium containing instructions for controlling a capacitance measuring apparatus including: a circuit in which a first capacitor formed of known capacitance is serially connected to a second capacitor formed of unknown capacitance and the circuit having one end part grounded; and a third capacitor which has one end part thereof connected to the other end part of the circuit and the other end part thereof grounded, and applies charging voltage thereof to the other end part of the circuit to charge the first capacitor and the second capacitor with electric charge, the instructions comprising:
- a first discharge control step of controlling partially discharging electric charge charged in the third capacitor and discharging the entire electric charge charged in the first capacitor;
- a second discharge control step of controlling discharging the entire electric charge charged in the second capacitor at almost the same timing as the process at the first discharge step;
- a number measuring control step of controlling counting numbers of discharges in the processes at the first discharge step and the second discharge step;
- a comparison control step of controlling comparing charging voltage of the second capacitor with reference voltage;
- a computation control step of controlling computing capacitance of the second capacitor, when discharge in the processes at the first discharge step and the second discharge step is repeated, at a time when the charging voltage of the second capacitor is matched with the reference voltage or when it becomes smaller than the reference voltage from the compared result in the process at the comparing step, based on the number of discharges counted in the process at the number measuring control step; and
- an outputting step of outputting the capacitance of the second capacitor to a control module.

* * * * *

UNITED STATES PATENT AND TRADEMARK OFFICE
CERTIFICATE OF CORRECTION

| | |
|---|---|
| PATENT NO. | : 7,205,776 B2 |
| APPLICATION NO. | : 11/221108 |
| DATED | : April 17, 2007 |
| INVENTOR(S) | : Masahiro Kinoshita et al. |

It is certified that error appears in the above-identified patent and that said Letters Patent is hereby corrected as shown below:

On the cover page:

In section (*) Notice, line 4, please remove "This patent is subject to a terminal disclaimer."

Signed and Sealed this

Nineteenth Day of June, 2007

JON W. DUDAS
*Director of the United States Patent and Trademark Office*